US012058858B2

(12) United States Patent
Zhang et al.

(10) Patent No.: US 12,058,858 B2
(45) Date of Patent: Aug. 6, 2024

(54) THREE-DIMENSIONAL MEMORY DEVICES AND METHODS FOR FORMING THE SAME

(71) Applicant: YANGTZE MEMORY TECHNOLOGIES CO., LTD., Wuhan (CN)

(72) Inventors: Kun Zhang, Wuhan (CN); Linchun Wu, Wuhan (CN); Wenxi Zhou, Wuhan (CN); Zhiliang Xia, Wuhan (CN); Zongliang Huo, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 843 days.

(21) Appl. No.: 17/117,690

(22) Filed: Dec. 10, 2020

(65) Prior Publication Data

US 2022/0157847 A1 May 19, 2022

Related U.S. Application Data

(63) Continuation of application No. PCT/CN2020/128712, filed on Nov. 13, 2020.

(51) Int. Cl.
*H10B 43/27* (2023.01)
*H01L 21/02* (2006.01)
(Continued)

(52) U.S. Cl.
CPC ....... *H10B 43/27* (2023.02); *H01L 21/02164* (2013.01); *H01L 21/2255* (2013.01);
(Continued)

(58) Field of Classification Search
CPC ........ H10B 43/27; H10B 41/27; H10B 41/35; H10B 43/35; H01L 21/02164;
(Continued)

(56) References Cited

U.S. PATENT DOCUMENTS 11,201,166 B2 * 12/2021 Choi ..................... H10B 41/27
11,387,233 B2 * 7/2022 Su ....................... H01L 29/7851
(Continued)

FOREIGN PATENT DOCUMENTS

CN 110088903 A 8/2019
CN 111758164 A 10/2020
(Continued)

OTHER PUBLICATIONS

International Search Report issued in corresponding International Application No. PCT/CN2020/128712, mailed Jul. 26, 2021, 4 pages.

*Primary Examiner* — David Vu
*Assistant Examiner* — Brandon C Fox
(74) *Attorney, Agent, or Firm* — BAYES PLLC

(57) ABSTRACT

A 3D memory device includes a memory stack including interleaved stack conductive layers and stack dielectric layers, a semiconductor layer, and a channel structure extending vertically through the memory stack into the semiconductor layer. A first lateral dimension of a first portion of the channel structure facing the semiconductor layer is greater than a second lateral dimension of a second portion of the channel structure facing the memory stack. The channel structure includes a memory film and a semiconductor channel A first doping concentration of part of the semiconductor channel in the first portion of the channel structure is greater than a second doping concentration of part of the semiconductor channel in the second portion of the channel structure.

20 Claims, 13 Drawing Sheets

(51) Int. Cl.
*H01L 21/225* (2006.01)
*H01L 21/311* (2006.01)
*H01L 21/3115* (2006.01)
*H01L 21/3205* (2006.01)
*H01L 21/3213* (2006.01)
*H01L 21/3215* (2006.01)
*H01L 23/00* (2006.01)
*H01L 25/065* (2023.01)
*H01L 25/18* (2023.01)
*H01L 29/04* (2006.01)
*H01L 29/10* (2006.01)
*H01L 29/16* (2006.01)
*H10B 41/27* (2023.01)

(52) U.S. Cl.
CPC .... *H01L 21/2257* (2013.01); *H01L 21/31111* (2013.01); *H01L 21/3115* (2013.01); *H01L 21/32055* (2013.01); *H01L 21/32133* (2013.01); *H01L 21/32155* (2013.01); *H01L 24/08* (2013.01); *H01L 25/0657* (2013.01); *H01L 25/18* (2013.01); *H01L 29/04* (2013.01); *H01L 29/1037* (2013.01); *H01L 29/16* (2013.01); *H10B 41/27* (2023.02); *H01L 2224/08145* (2013.01); *H01L 2924/1431* (2013.01); *H01L 2924/14511* (2013.01)

(58) Field of Classification Search
CPC ......... H01L 21/31111; H01L 21/32055; H01L 21/32133; H01L 29/04; H01L 29/1037; H01L 29/16
See application file for complete search history.

(56) References Cited

U.S. PATENT DOCUMENTS

| | | |
|---|---|---|
| 2016/0071860 A1 | 3/2016 | Kai et al. |
| 2016/0071861 A1 | 3/2016 | Serov et al. |
| 2016/0329101 A1* | 11/2016 | Sakakibara ............ H10B 41/27 |
| 2017/0243651 A1* | 8/2017 | Choi ...................... H10B 43/35 |
| 2020/0119025 A1 | 4/2020 | Jiang et al. |
| 2020/0194446 A1 | 6/2020 | Nishida et al. |
| 2020/0219896 A1 | 7/2020 | Mushiga et al. |
| 2020/0273880 A1 | 8/2020 | Sotome et al. |
| 2020/0312865 A1 | 10/2020 | Ge et al. |
| 2020/0312868 A1 | 10/2020 | Xiao |

FOREIGN PATENT DOCUMENTS

| | | |
|---|---|---|
| CN | 111801797 A | 10/2020 |
| CN | 111801799 A | 10/2020 |
| TW | 201739007 A | 11/2017 |
| TW | 202010051 A | 3/2020 |
| TW | 202011581 A | 3/2020 |
| TW | 202034497 A | 9/2020 |

* cited by examiner

THREE-DIMENSIONAL MEMORY DEVICES AND METHODS FOR FORMING THE SAME

CROSS-REFERENCE TO RELATED APPLICATIONS

This application is continuation of International Application No. PCT/CN2020/128712, filed on Nov. 13, 2020, entitled "THREE-DIMENSIONAL MEMORY DEVICES AND METHODS FOR FORMING THE SAME," which is hereby incorporated by reference in its entirety.

BACKGROUND

The present disclosure relates to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells.

The 3D memory architecture includes a memory array and peripheral devices for controlling signals to and from the memory array.

SUMMARY

Embodiments of 3D memory devices and methods for forming the same are disclosed herein.

In one example, a 3D memory device includes a memory stack including interleaved stack conductive layers and stack dielectric layers, a semiconductor layer, and a channel structure extending vertically through the memory stack into the semiconductor layer. A first lateral dimension of a first portion of the channel structure facing the semiconductor layer is greater than a second lateral dimension of a second portion of the channel structure facing the memory stack. The channel structure includes a memory film and a semiconductor channel. A first doping concentration of part of the semiconductor channel in the first portion of the channel structure is greater than a second doping concentration of part of the semiconductor channel in the second portion of the channel structure.

In another example, a 3D memory device includes a semiconductor structure including a memory stack including interleaved stack conductive layers and stack dielectric layers, a semiconductor layer, and a channel structure extending vertically through the memory stack into the semiconductor layer. The channel structure includes a memory film and a semiconductor channel. A doping concentration of the semiconductor channel is greater towards a source than away from the source.

In still another example, a method for forming a 3D memory device is disclosed. A semiconductor layer is formed above a substrate, and a stack structure is formed above the semiconductor layer. A channel structure extending vertically through the stack structure and the semiconductor layer is formed. The channel structure includes a memory film and a semiconductor channel. A first doping concentration of part of the semiconductor channel in a first portion of the channel structure facing the semiconductor layer is greater than a second doping concentration of part of the semiconductor channel in a second portion of the channel structure facing the stack structure. The substrate and part of the memory film in the first portion of the channel structure are removed to expose the part of the semiconductor channel in the first portion of the channel structure. A conductive layer in contact with the semiconductor layer and the exposed part of the semiconductor channel in the first portion of the channel structure is formed.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
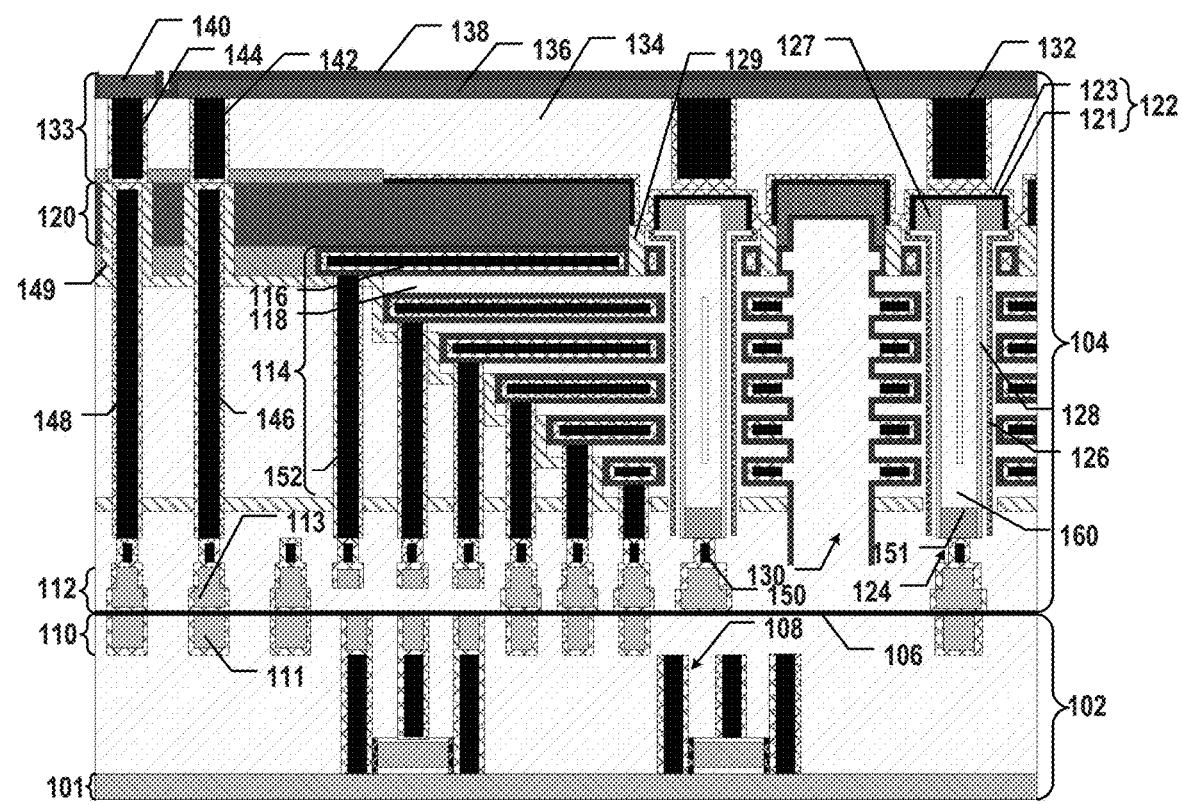
FIG. 1A illustrates a side view of a cross-section of an exemplary 3D memory device, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure, or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context.

For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or vertical interconnect access (via) contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, such as 3D NAND memory devices, semiconductor plugs are selectively grown to surround the sidewalls of channel structures, e.g., known as sidewall selective epitaxial growth (SEG). Compared with another type of semiconductor plugs that are formed at the lower end of the channel structures, e.g., bottom SEG, the formation of sidewall SEG avoids the etching of the memory film and semiconductor channel at the bottom surface of channel holes (also known as SONO punch), thereby increasing the process window, in particular when fabricating 3D NAND memory devices with advanced technologies, such as having 90 or more levels with a multi-deck architecture.

However, because intrinsic (pure, undoped) semiconductor materials, such as intrinsic polysilicon, are used to form the semiconductor channel, a relatively high potential barrier exists between the semiconductor channel and the sidewall SEG or the conductive layer in contact with the semiconductor channel, thereby introducing high contact resistance therebetween. The electric performance of the 3D memory device can be affected by the high contact resistance.

Various embodiments in accordance with the present disclosure provide 3D memory devices with reduced contact resistance and sheet resistance of the semiconductor channels. In some embodiments, the semiconductor channel is partially in situ doped such that part of the semiconductor channel that forms the source contact is highly doped to lower the potential barrier while leaving another part of the semiconductor channel that forms the memory cells remain undoped or lowly doped. In some embodiments, part of the channel structure not forming the memory cells includes an extra enlarging structure (e.g., having highly doped polysilicon or silicon oxide) serving as the doping source to in situ dope the part of the semiconductor channel in contact with the doping source during the thermal processes in fabricating the 3D memory device. In some embodiments, one end of each channel structure is opened from the backside to expose the doped part of the respective semiconductor channel, and the 3D memory device further includes a conductive layer electrically connecting the exposed doped parts of the semiconductor channels to further reduce the contact resistance and sheet resistance. As a result, the electric performance of the 3D memory devices can be improved.

FIG. 1A illustrates a side view of a cross-section of an exemplary 3D memory device 100, according to some embodiments of the present disclosure. In some embodiments, 3D memory device 100 is a bonded chip including a first semiconductor structure 102 and a second semiconductor structure 104 stacked over first semiconductor structure 102. First and second semiconductor structures 102 and 104 are joined at a bonding interface 106 therebetween, according to some embodiments. As shown in FIG. 1A, first semiconductor structure 102 can include a substrate 101, which can include silicon (e.g., single crystalline silicon, c-Si), silicon germanium (SiGe), gallium arsenide (GaAs), germanium (Ge), SOI or any other suitable materials.

First semiconductor structure 102 of 3D memory device 100 can include peripheral circuits 108 on substrate 101. It is noted that x and y axes are included in FIG. 1A to further illustrate the spatial relationship of the components in 3D memory device 100 having substrate 101. Substrate 101 includes two lateral surfaces (e.g., a top surface and a bottom surface) extending laterally in the x-direction (i.e., the lateral direction). As used herein, whether one component (e.g., a layer or a device) is "on," "above," or "below" another component (e.g., a layer or a device) of a semiconductor device (e.g., 3D memory device 100) is determined relative to the substrate of the semiconductor device (e.g., substrate 101) in the y-direction (i.e., the vertical direction) when the substrate is positioned in the lowest plane of the semiconductor device in the y-direction. The same notion for describing spatial relationships is applied throughout the present disclosure.

In some embodiments, peripheral circuit 108 is configured to control and sense 3D memory device 100. Peripheral circuit 108 can be any suitable digital, analog, and/or mixed-signal control and sensing circuits used for facilitating the operation of 3D memory device 100 including, but not limited to, a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors). Peripheral circuits 108 can include transistors formed "on" substrate 101, in which the entirety or part of the transistors are formed in substrate 101 (e.g., below the top surface of substrate 101) and/or directly on substrate 101. Isolation regions (e.g., shallow trench isolations (STIs)) and doped regions (e.g., source regions and drain regions of the transistors) can be formed in substrate 101 as well. The transistors are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.), according to some embodiments. It is understood that in some embodiments, peripheral circuit 108 may further include any other circuits compatible with the advanced logic processes including logic circuits, such as processors and programmable logic devices (PLDs), or memory circuits, such as static random-access memory (SRAM) and dynamic RAM (DRAM).

In some embodiments, first semiconductor structure 102 of 3D memory device 100 further includes an interconnect layer (not shown) above peripheral circuits 108 to transfer electrical signals to and from peripheral circuits 108. The interconnect layer can include a plurality of interconnects (also referred to herein as contacts), including lateral interconnect lines and vertical interconnect access (VIA) contacts. As used herein, the term "interconnects" can broadly include any suitable types of interconnects, such as middle-end-of-line (MEOL) interconnects and back-end-of-line (BEOL) interconnects. The interconnect layer can further include one or more interlayer dielectric (ILD) layers (also known as intermetal dielectric (IMD) layers) in which the interconnect lines and VIA contacts can form. That is, the interconnect layer can include interconnect lines and VIA contacts in multiple ILD layers. The interconnect lines and VIA contacts in the interconnect layer can include conductive materials including, but not limited to, tungsten (W), cobalt (Co), copper (Cu), aluminum (Al), silicides, or any combination thereof. The ILD layers in the interconnect layer can include dielectric materials including, but not limited to, silicon oxide, silicon nitride, silicon oxynitride, low dielectric constant (low-k) dielectrics, or any combination thereof.

As shown in FIG. 1A, first semiconductor structure 102 of 3D memory device 100 can further include a bonding layer 110 at bonding interface 106 and above the interconnect layer and peripheral circuits 108. Bonding layer 110 can include a plurality of bonding contacts 111 and dielectrics electrically isolating bonding contacts 111. Bonding contacts 111 can include conductive materials including, but not limited to, W, Co, Cu, Al, silicides, or any combination thereof. The remaining area of bonding layer 110 can be formed with dielectrics including, but not limited to, silicon oxide, silicon nitride, silicon oxynitride, low-k dielectrics, or any combination thereof. Bonding contacts 111 and surrounding dielectrics in bonding layer 110 can be used for hybrid bonding.

Similarly, as shown in FIG. 1A, second semiconductor structure 104 of 3D memory device 100 can also include a bonding layer 112 at bonding interface 106 and above bonding layer 110 of first semiconductor structure 102. Bonding layer 112 can include a plurality of bonding contacts 113 and dielectrics electrically isolating bonding contacts 113. Bonding contacts 113 can include conductive materials including, but not limited to, W, Co, Cu, Al, silicides, or any combination thereof. The remaining area of bonding layer 112 can be formed with dielectrics including, but not limited to, silicon oxide, silicon nitride, silicon oxynitride, low-k dielectrics, or any combination thereof. Bonding contacts 113 and surrounding dielectrics in bonding layer 112 can be used for hybrid bonding. Bonding contacts 113 are in contact with bonding contacts 111 at bonding interface 106, according to some embodiments.

As described below in detail, second semiconductor structure 104 can be bonded on top of first semiconductor structure 102 in a face-to-face manner at bonding interface 106. In some embodiments, bonding interface 106 is disposed between bonding layers 110 and 112 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some embodiments, bonding interface 106 is the place at which bonding layers 112 and 110 are met and bonded. In practice, bonding interface 106 can be a layer with a certain thickness that includes the top surface of bonding layer 110 of first semiconductor structure 102 and the bottom surface of bonding layer 112 of second semiconductor structure 104.

In some embodiments, second semiconductor structure 104 of 3D memory device 100 further includes an interconnect layer (not shown) above bonding layer 112 to transfer electrical signals. The interconnect layer can include a plurality of interconnects, such as MEOL interconnects and BEOL interconnects. The interconnect layer can further include one or more ILD layers in which the interconnect lines and VIA contacts can form. The interconnect lines and VIA contacts in the interconnect layer can include conductive materials including, but not limited to W, Co, Cu, Al, silicides, or any combination thereof. The ILD layers in the interconnect layer can include dielectric materials including, but not limited to, silicon oxide, silicon nitride, silicon oxynitride, low-k dielectrics, or any combination thereof.

In some embodiments, 3D memory device 100 is a NAND Flash memory device in which memory cells are provided in the form of an array of NAND memory strings.

As shown in FIG. 1A, second semiconductor structure 104 of 3D memory device 100 can include an array of channel structures 124 functioning as the array of NAND memory strings. As shown in FIG. 1A, each channel structure 124 can extend vertically through a plurality of pairs each including a stack conductive layer 116 and a stack dielectric layer 118. The interleaved stack conductive layers 116 and stack dielectric layers 118 are part of a memory stack 114. The number of the pairs of stack conductive layers 116 and stack dielectric layers 118 in memory stack 114 (e.g., 32, 64, 96, 128, 160, 192, 224, 256, or more) determines the number of memory cells in 3D memory device 100. It is understood that in some embodiments, memory stack 114 may have a multi-deck architecture (not shown), which includes a plurality of memory decks stacked over one another. The numbers of the pairs of stack conductive layers 116 and stack dielectric layers 118 in each memory deck can be the same or different.

Memory stack 114 can include a plurality of interleaved stack conductive layers 116 and stack dielectric layers 118. Stack conductive layers 116 and stack dielectric layers 118 in memory stack 114 can alternate in the vertical direction. In other words, except the ones at the top or bottom of memory stack 114, each stack conductive layer 116 can be adjoined by two stack dielectric layers 118 on both sides, and each stack dielectric layer 118 can be adjoined by two stack conductive layers 116 on both sides. Stack conductive layers 116 can include conductive materials including, but not limited to, W, Co, Cu, Al, polysilicon, doped silicon, silicides, or any combination thereof. Each stack conductive layer 116 can include a gate electrode (gate line) surrounded by an adhesive/barrier layer and a gate dielectric layer. The gate electrode of stack conductive layer 116 can extend laterally as a word line, ending at one or more staircase structures of memory stack 114. Stack dielectric layers 118 can include dielectric materials including, but not limited to, silicon oxide, silicon nitride, silicon oxynitride, or any combination thereof.

As shown in FIG. 1A, second semiconductor structure 104 of 3D memory device 100 can also include a semiconductor layer 120 above memory stack 114. Semiconductor layer 120 can include a semiconductor material, such as silicon. In some embodiments, semiconductor layer 120 includes polysilicon formed by deposition techniques, as described below in detail. In some embodiments, semiconductor layer 120 is doped to a desired doping concentration to reduce sheet resistance thereof. Semiconductor layer 120 can be doped with any suitable N-type dopants, such as phosphorus (P), arsenic (Ar), or antimony (Sb), which contribute free electrons and increase the conductivity of the intrinsic semiconductor. For example, semiconductor layer 120 may include N-type doped polysilicon.

In some embodiments, each channel structure 124 includes a channel hole filled with a semiconductor layer (e.g., as a semiconductor channel 128) and a composite dielectric layer (e.g., as a memory film 126). In some embodiments, semiconductor channel 128 includes silicon, such as amorphous silicon, polysilicon, or single crystalline silicon. In some embodiments, memory film 126 is a composite layer including a tunneling layer, a storage layer (also known as a "charge trap layer"), and a blocking layer. The remaining space of channel structure 124 can be partially or fully filled with a capping layer 160 including dielectric materials, such as silicon oxide, and/or an air gap. Channel structure 124 can have a cylinder shape (e.g., a pillar shape). Capping layer 160, semiconductor channel 128, the tunneling layer, storage layer, and blocking layer of memory film 126 are arranged radially from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high-k dielectrics, or any combination thereof. In one example, memory film 126 may include a composite layer of silicon oxide/silicon oxynitride/silicon oxide (ONO).

In some embodiments, channel structure 124 further includes a channel plug 151 in the bottom portion (e.g., at the lower end) of channel structure 124. As used herein, the "upper end" of a component (e g, channel structure 124) is the end farther away from substrate 101 in the y-direction, and the "lower end" of the component (e.g., channel structure 124) is the end closer to substrate 101 in the y-direction when substrate 101 is positioned in the lowest plane of 3D memory device 100. Channel plug 151 can include semiconductor materials (e.g., polysilicon). In some embodiments, channel plug 151 functions as the drain of the NAND memory string.

As shown in FIG. 1A, each channel structure 124 can extend vertically through interleaved stack conductive layers 116 and stack dielectric layers 118 of memory stack 114 into semiconductor layer 120. The upper end of each channel structure 124 can be below the top surface of semiconductor layer 120. That is, channel structure 124 does not extend beyond the top surface of semiconductor layer 120, according to some embodiments. Although not shown in the side view of FIG. 1A, it is understood that semiconductor layer 120 may be a continuous layer extending laterally, and each channel structure 124 may be surrounded by semiconductor layer 120 in the plan view. In some embodiments, the upper end of memory film 126 is below the upper end of semiconductor channel 128 in channel structure 124 and the top surface of semiconductor layer 120, as shown in FIG. 1A.

Figure 2:
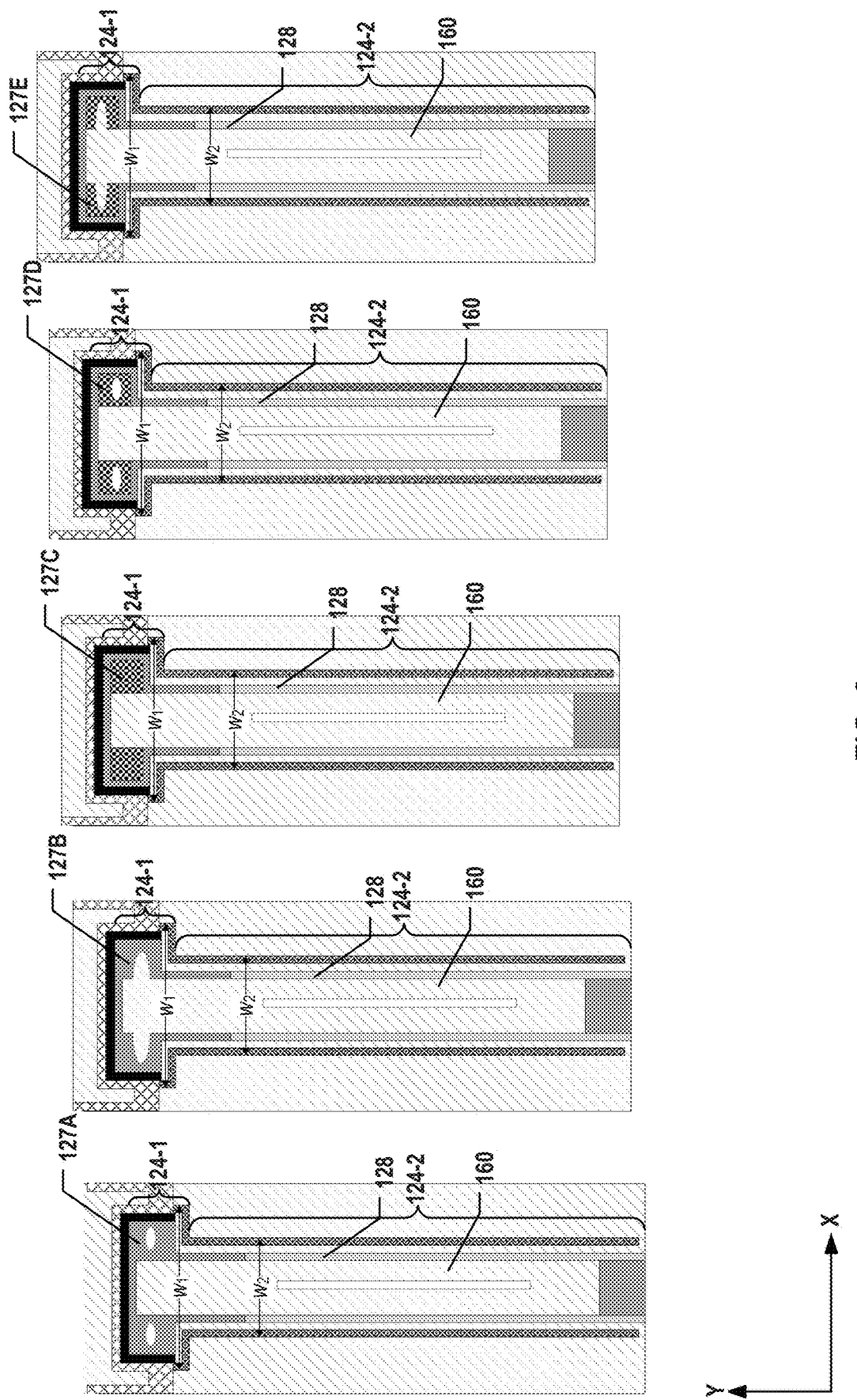
FIG. 2 illustrates enlarged side views of cross-sections of various exemplary channel structures in a 3D memory device, according to various embodiments of the present disclosure.

Also referred to the enlarged side views of various examples of channel structure 124 in FIG. 2, channel structure 124 can include two portions: a first portion 124-1 facing semiconductor layer 120 (e.g., shown in FIG. 1A) and a second portion 124-2 facing memory stack 114 (e.g., shown in FIG. 1A). For example, first portion 124-1 of channel structure 124 may be surrounded by semiconductor layer 120 (e.g., vertically between the top and bottom surfaces of semiconductor layer 120). In some embodiments, in channel structure 124, the lateral dimension (e.g., the diameter) of first portion 124-1 is greater than the lateral dimension (e.g., the diameter) of second portion 124-2 of channel structure 124. For example, the shape of channel structure 124 may be viewed as two connected concentric cylinders (pillars) with different diameters. In some embodiments, first portion 124-1 of channel structure 124 further includes an enlarging structure 127 in contact with semiconductor channel 128. For example, enlarging structure 127 may be laterally sandwiched between semiconductor channel 128 and capping layer 160 in first portion 124-1 of channel structure 124. Due to the existence of enlarging structure 127 in first portion 124-1, but not in second portion 124-2, of channel structure 124, the lateral dimension of first portion 124-1 becomes greater than the lateral dimension of second portion 124-2, according to some embodiments.

As described below in detail with respect to the fabrication process, enlarging structure 127 can serve as the doping source for partially in situ doping semiconductor channel 128 during the fabrication process of 3D memory device 100. Consistent with the scope of the present disclosure, the materials and/or shapes of enlarging structure 127 may vary as along as the dopant can diffuse from enlarging structure 127 to semiconductor channel 128 during the fabrication process. In one implementation, for example, enlarging structure 127 may include the same material as semiconductor channel 128, such as polysilicon (e.g., 127A and 127B in FIG. 2). In another implementation, for example, a different material from semiconductor channel 128, such as silicon oxide (e.g., 127C, 127D, and 127E in FIG. 2). For example, enlarging structure 127 may also enclose seam(s) or other defects (e.g., 127A and 127D in FIG. 2) therein, or both enlarging structure 127 and capping layer 160 may enclose seam(s) or other defects (e.g., 127B and 127E in FIG. 2) therein. It is understood that in the examples in which enlarging structure 127 and semiconductor channel 128 have the same material (e.g., polysilicon), the interface and boundary between enlarging structure 127 and semiconductor channel 128 may become indistinguishable and thus cannot be discerned in the final product of 3D memory device 100.

Due to the partial in situ doping from the doping source (i.e., enlarging structure 127 in first portion 124-1 of channel structure 124), part of semiconductor channel 128 is doped with the dopant from the doping source, according to some embodiments. As the dopant diffuses from enlarging structure 127 to the part of semiconductor channel 128 in contact with enlarging structure 127 in first portion 124-1 of channel structure 124 (and may further diffuse to part of semiconductor channel 128 in second portion 124-2 of channel structure 124), a doping concentration profile may appear in semiconductor channel 128 to show the difference of doping concentrations in first and second portions 124-1 and 124-2 of channel structure 124. In some embodiments, the doping concentration of the part of semiconductor channel 128 in first portion 124-1 of channel structure 124 is greater than the doping concentration of the part of semiconductor channel 128 in second portion 124-2 of channel structure 124. In one implementation, the doping concentration may be nominally the same within the part of semiconductor channel 128 in first portion 124-1 of channel structure 124. In another implementation, the doping concentration may gradually change within the part of semiconductor channel 128 in first portion 124-1 of channel structure 124. It is understood that in some examples, the diffusion of the dopant may be confined in first portion 124-1 of channel structure 124, such that the part of semiconductor channel 128 in second portion 124-2 of channel structure 124 may still include intrinsic semiconductor, such as intrinsic polysilicon (i.e., the doping concentration is nominally zero). In other examples, part of semiconductor channel 128 in second portion 124-2 that is close to first portion 124-1 of channel structure 124 may be doped as well (e.g., with a doping concentration lower than that in first portion 124-1), while the remainder of semiconductor channel 128 in second portion 124-2 (e.g., the part forming the memory cells of NAND memory strings) may still include intrinsic semiconductor, such as intrinsic polysilicon. Nevertheless, a reduction of doping concentration in semiconductor channel 128 can be found in second portion 124-2 compared with first portion 124-1 of channel structure 124.

In some embodiments, the doped part of semiconductor channel 128 in first portion 124-1 of channel structure 124 includes N-type doped polysilicon. The dopant can be any suitable N-type dopants, such as P, Ar, or Sb. In some embodiments, the doping concentration of the doped part of semiconductor channel 128 in first portion 124-1 of channel structure 124 is between about $10^{19}$ cm$^{-3}$ and about $10^{21}$ cm$^{-3}$, such as between $10^{19}$ cm$^{-3}$ and $10^{21}$ cm$^{-3}$ (e.g., $10^{19}$ cm$^{-3}$, $2 \times 10^{19}$ cm$^{-3}$, $3 \times 10^{19}$ cm$^{-3}$, $4 \times 10^{19}$ cm$^{-3}$, $5 \times 10^{19}$ cm$^{-3}$, $6 \times 10^{19}$ cm$^{-3}$, $7 \times 10^{19}$ cm$^{-3}$, $8 \times 10^{19}$ cm$^{-3}$, $9 \times 10^{19}$ cm$^{-3}$, $10^{20}$ cm$^{-3}$, $2 \times 10^{20}$ cm$^{-3}$, $3 \times 10^{20}$ cm$^{-3}$, $4 \times 10^{20}$ cm$^{-3}$, $5 \times 10^{20}$ cm$^{-3}$, $6 \times 10^{20}$ cm$^{-3}$, $7 \times 10^{20}$ cm$^{-3}$, $8 \times 10^{20}$ cm$^{-3}$, $9 \times 10^{20}$ cm$^{-3}$, $10^{21}$ cm$^{-3}$, any range bounded by the lower end by any of these values, or in any range defined by any two of these values). In some embodiments, the doping concentration of enlarging structure 127 (in the final product of 3D memory device 100 after diffusion) is equal to or greater than the doping concentration of the doped part of semiconductor channel 128 in first portion 124-1 of channel structure 124. That is, the doping concentration of enlarging structure 127 is not smaller than that of the doped part of semiconductor channel 128 in first portion 124-1 of channel structure 124, according to some embodiments. Accordingly, the doping concentration of enlarging structure 127 is greater than the doping concentration of the part of semiconductor channel 128 in second portion 124-2 of channel structure 124, according to some embodiments. In other words, in some embodiments, the doping concentration of semiconductor channel 128 is greater towards the source (e.g., the source of the corresponding NAND memory string) than away from the source. The doping concentration profile described above can reduce the potential barrier, the contact resistance, and the sheet resistance at the doped part of semiconductor channel 128 in first portion 124-1 of channel structure 124, which makes electrical connections for the source of the NAND memory string, without altering the intrinsic nature of another part of semiconductor channel 128 that forms the memory cells of the NAND memory string.

As shown in FIG. 1A, in some embodiments, second semiconductor structure 104 of 3D memory device 100 can also include a conductive layer 122 above and in contact with semiconductor layer 120 as well as the doped part of semiconductor channel 128 in first portion 124-1 of channel structure 124. Conductive layer 122 can electrically connect multiple channel structures 124. Although not shown in the side view of FIG. 1A, it is understood that conductive layer 122 may be a continuous conductive layer in contact with multiple channel structures 124 and semiconductor layer 120. As a result, conductive layer 122 and semiconductor layer 120 can together provide electrical connections between the sources of an array of NAND memory string in the same block, i.e., the array common source (ACS). In some embodiments, conductive layer 122 includes two portions in the lateral direction: a first portion on semiconductor layer 120 (outside of the regions of channel structures 124) and a second portion in contact with the doped parts of semiconductor channels 128 in first portions 124-1 of channel structures 124 (within the regions of channel structures 124). That is, at least part of conductive layer 122 (i.e., the first portion) is on semiconductor layer 120, according to some embodiments. The remainder of conductive layer 122 (i.e., the second portion) surrounding first portion 124-1 of each channel structure 124 extending into semiconductor layer 120 is in contact with the doped part of semiconductor channels 128, according to some embodiments.

In some embodiments, conductive layer 122 includes multiple layers in the vertical direction, including a metal silicide layer 121 and a metal layer 123 above and in contact with metal silicide layer 121. Each of metal silicide layer 121 and metal layer 123 can be a continuous film. Metal silicide layer 121 can be disposed above and in contact semiconductor layer 120 (in the first portion of conductive layer 122) and first portions 124-1 of channel structures 124 (in the second portion of conductive layer 122). In some embodiments, part of metal silicide layer 121 surrounds and contacts the doped parts of semiconductor channels 128 in first portions 124-1 of channel structures 124 to make electrical connections with multiple channel structures 124. Metal silicide layer 121 can include a metal silicide, such as copper silicide, cobalt silicide, nickel silicide, titanium silicide, tungsten silicide, silver silicide, aluminum silicide, gold silicide, platinum silicide, any other suitable metal silicide, or any combinations thereof. In some embodiments in which semiconductor channel 128 includes polysilicon, metal silicide layer 121 in contact with the doped part of semiconductor channel 128 can further reduce the contact resistance therebetween. Metal layer 123 is above and in contact with metal silicide layer 121, according to some embodiments. Metal layer 123 can include a metal, such as W, Co, Cu, Al, nickel (Ni), titanium (Ti), any other suitable metal, or any combinations thereof. It is understood that the metal in metal layer 123 may broadly include any suitable conductive metal compounds and metal alloys as well, such as titanium nitride (TiN) and tantalum nitride (TaN), for example as an adhesive/barrier layer therein. Metal layer 123 can further reduce the overall resistance of conductive layer 122.

In addition to doping part of semiconductor channel 128, the formation of conductive layer 122 in contact with the doped part of semiconductor channel 128 can further reduce the resistance (e.g., contact resistance and sheet resistance) between channel structures 124 (i.e., at the ACS of NAND memory strings in the same block), compared with the known solutions using sidewall SEG alone to make source contact, thereby improving the electric performance of 3D memory device 100. As a result, to maintain the same conductance/resistance between channel structures 124, the thickness of semiconductor layer 120 can be reduced, for example, to be less than about 50 nm, such as less than 50 nm. In some embodiments, the thickness of semiconductor layer 120 is between about 10 nm and about 30 nm, such as between 10 nm and 30 nm (e.g., 10 nm, 11 nm, 12 nm, 13 nm, 14 nm, 15 nm, 16 nm, 17 nm, 18 nm, 19 nm, 20 nm, 21 nm, 22 nm, 23 nm, 24 nm, 25 nm, 26 nm, 27 nm, 28 nm, 29 nm, 30 nm, any range bounded by the lower end by any of these values, or in any range defined by any two of these values). Semiconductor layer 120 in combination with conductive layer 122, which surround first portions 124-1 channel structures 124, can enable gate-induced drain leakage (GIDL)-assisted body biasing for erase operations for 3D memory device 100. The GIDL around the source select gate of the NAND memory string can generate hole current into the NAND memory string to raise the body potential for erase operations. That is, 3D memory device 100 is configured to generate GIDL-assisted body biasing when performing an erase operation, according to some embodiments.

In some embodiments, second semiconductor structure 104 further includes barrier structures 129 each surrounding a respective part of second portion 124-2 of channel structure 124. As described below in detail, barrier structure 129 may be the remainder of a barrier structure used during the fabrication process for defining the lateral boundaries of first portion 124-1 of channel structure 124. As a result, the lateral dimension (e.g., the inner diameter) of barrier structure 129 can be nominally the same as the lateral dimension (e.g., the diameter) of first portion 124-1 of channel structure 124. In some embodiments, barrier structure 129 includes silicon oxide.

As shown in FIG. 1A, second semiconductor structure 104 of 3D memory device 100 can further include insulating structures 130 each extending vertically through interleaved stack conductive layers 116 and stack dielectric layers 118 of memory stack 114. Insulating structure 130 can extend further into semiconductor layer 120, as shown in FIG. 1A. It is understood that in some embodiments, insulating structure 130 may not extend into semiconductor layer 120, i.e., having the top surface thereof flush with the bottom surface of semiconductor layer 120. Each insulating structure 130 can also extend laterally to separate memory stack 114 into a plurality of blocks. That is, memory stack 114 can be divided into a plurality of memory blocks by insulating structures 130, such that the array of channel structures 124 can be separated into each memory block. Different from the slit structures in some known 3D NAND memory devices, which include front side source contacts, insulating structure 130 does not include any contact therein (i.e., not functioning as the source contact) and thus, does not introduce parasitic capacitance and leakage current with stack conductive layers 116 (including word lines), according to some embodiments. In some embodiments, each insulating structure 130 includes an opening (e.g., a slit) filled with one or more dielectric materials, including, but not limited to, silicon oxide, silicon nitride, silicon oxynitride, or any combination thereof. In one example, each insulating structure 130 may be filled with silicon oxide.

Instead of having front side source contacts, 3D memory device 100 can include backside source contacts 132 above memory stack 114 and in contact with conductive layer 122, as shown in FIG. 1A. Source contact 132 and memory stack 114 (and insulating structure 130 therethrough) can be disposed on opposites sides of semiconductor layer 120 and thus viewed as a "backside" source contact. In some embodiments, source contact 132 is electrically connected to semiconductor channel 128 of channel structure 124 through conductive layer 122. It is understood that in some examples, second semiconductor structure 104 may not include conductive layer 122, and source contact 132 may be in direct contact with the doped part of semiconductor channel 128 in first portion 124-1 of channel structure 124, for example, when the doping concentration of the doped part of semiconductor channel 128 is sufficiently high. It is further understood that although source contacts 132 in FIG. 1A are laterally aligned with channel structures 124, respectively, the existence of conductive layer 122 (e.g., a continuous conductive layer) may allow source contacts 132 to be in contact with any part of conductive layer 122 without being laterally aligned with channel structures 124. Source contacts 132 can include any suitable types of contacts. In some embodiments, source contacts 132 include a VIA contact. In some embodiments, source contacts 132 include a wall-shaped contact extending laterally. Source contact 132 can include one or more conductive layers, such as a metal layer (e.g., W, Co, Cu, or Al) or a silicide layer surrounded by an adhesive/barrier layer (e.g., TiN).

Figure 3A:
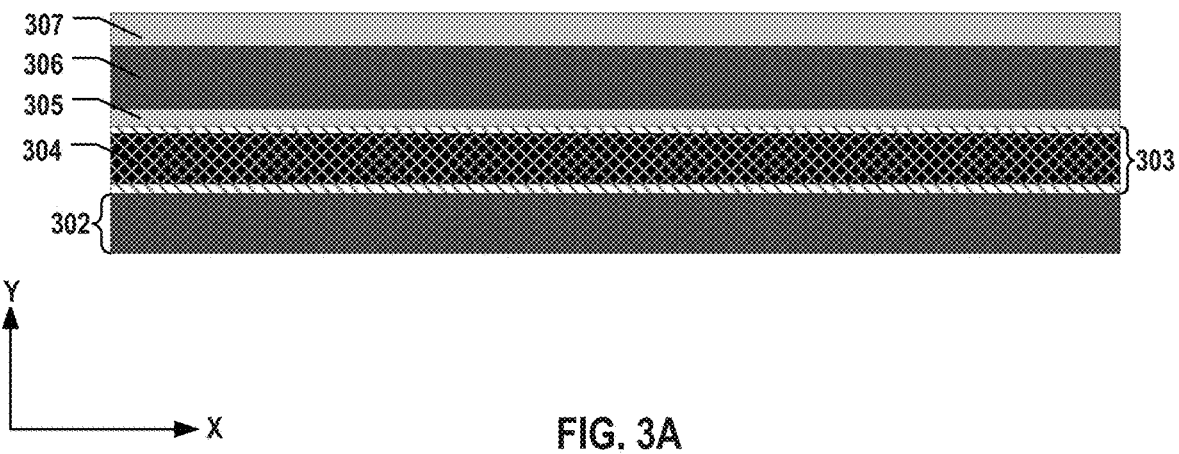
FIGS. 3A-3L illustrate a fabrication process for forming an exemplary 3D memory device, according to some embodiments of the present disclosure.
Figure 3B:
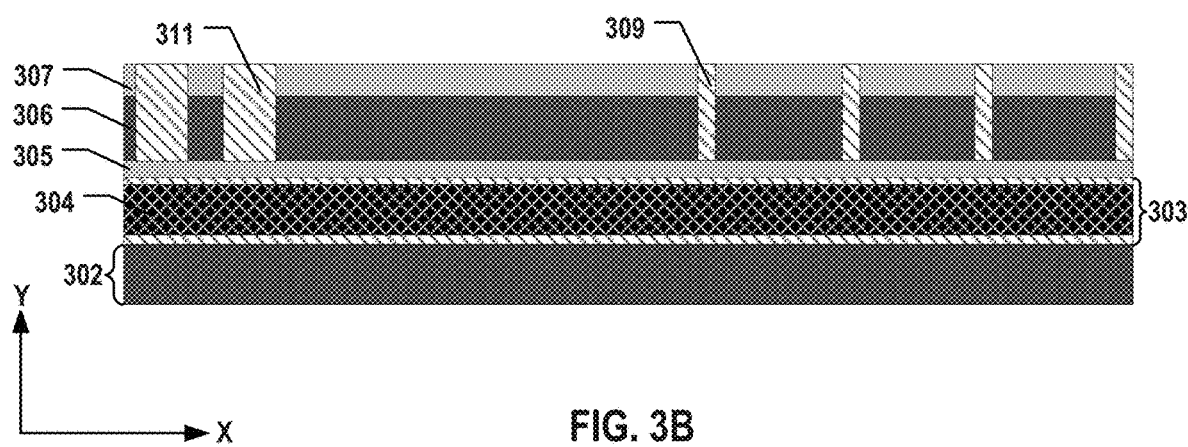
Figure 3C:
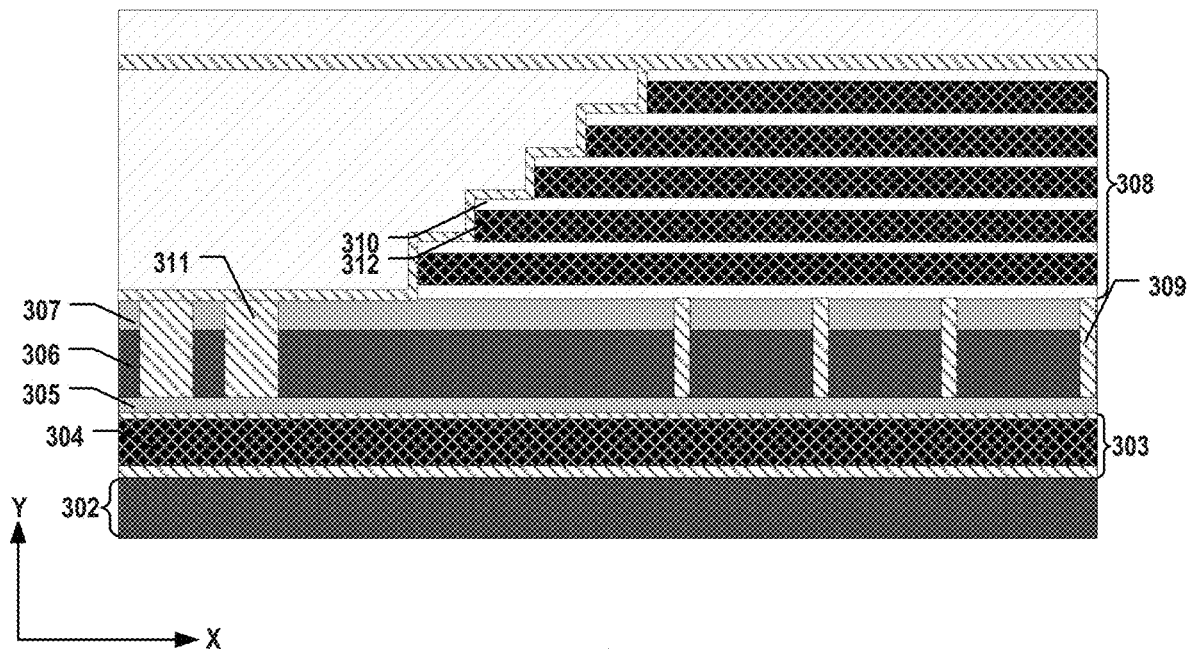
Figure 3D:
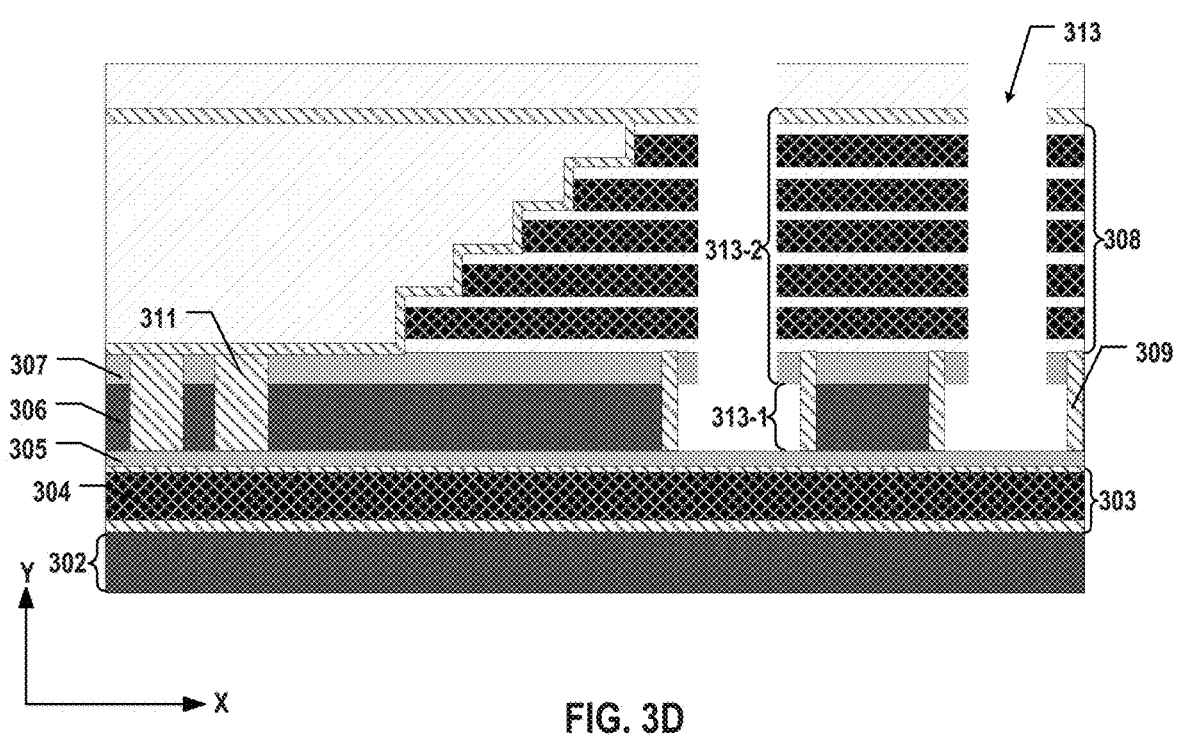

As shown in FIG. 1A, 3D memory device 100 can further include a BEOL interconnect layer 133 above and electrically connected to source contact 132 for pad-out, e.g., transferring electrical signals between 3D memory device 100 and external circuits. In some embodiments, interconnect layer 133 includes one or more ILD layers 134 on conductive layer 122 (or on semiconductor layer 120 in the case without conductive layer 122) and a redistribution layer 136 on ILD layers 134. The upper end of source contact 132 is flush with the top surface of ILD layers 134 and the bottom surface of redistribution layer 136, according to some embodiments. ILD layers 134 in interconnect layer 133 can include dielectric materials including, but not limited to, silicon oxide, silicon nitride, silicon oxynitride, low-k dielectrics, or any combination thereof. Redistribution layer 136 in interconnect layer 133 can include conductive materials including, but not limited to W, Co, Cu, Al, silicides, or any combination thereof. In one example, redistribution layer 136 may include Al. In some embodiments, interconnect layer 133 further includes a passivation layer 138 as the outmost layer for passivation and protection of 3D memory device 100. Parts of redistribution layer 136 can be exposed from passivation layer 138 to form contact pads 140. That is, interconnect layer 133 of 3D memory device 100 can also include contact pads 140 for wire bonding and/or bonding with an interposer.

In some embodiments, second semiconductor structure 104 of 3D memory device 100 further includes contacts 142 and 144 through ILD layer 134. In some embodiments, contact 142 extends through ILD layers 134 to be in contact with redistribution layer 136, such that contact 142 is electrically connected to semiconductor channel 128 of channel structure 124 through redistribution layer 136, source contact 132, and conductive layer 122. In some embodiments, contact 144 extends through ILD layers 134 to be in contact with contact pad 140. Contacts 142 and 144 each can include one or more conductive layers, such as a metal layer (e.g., W, Co, Cu, or Al) or a silicide layer surrounded by an adhesive layer (e.g., TiN).

In some embodiments, 3D memory device 100 further includes peripheral contacts 146 and 148 each extending vertically outside of memory stack 114. Each peripheral contact 146 or 148 can have the depth greater than the depth of memory stack 114 to extend vertically from bonding layer 112 through semiconductor layer 120 in a peripheral region that is outside of memory stack 114. In some embodiments, peripheral contact 146 is below and in contact with contact 142, such that the source of the NAND memory string is electrically connected to peripheral circuit 108 in first semiconductor structure 102 through at least conductive layer 122, source contact 132, interconnect layer 133, contact 142, and peripheral contact 146. In some embodiments, peripheral contact 148 is below and in contact with contact 144, such that peripheral circuit 108 in first semiconductor structure 102 is electrically connected to contact pad 140 for pad-out through at least contact 144 and peripheral contact 148. Peripheral contacts 146 and 148 each can include one or more conductive layers, such as a metal layer (e.g., W, Co, Cu, or Al) or a silicide layer surrounded by an adhesive/barrier layer (e.g., TiN). In some embodiments, conductive layer 122 is within the region of memory stack 114, i.e., does not extend laterally into the peripheral region, such that contacts 142 and 144 do not extend vertically through conductive layer 122 in order to be in contact with peripheral contacts 148 and 144, respectively. In some embodiments, peripheral contacts 146 and 148 extend through spacer structures 149 in semiconductor layer 120 to be electrically separated from surrounding semiconductor layer 120. As described below with respect to the fabrication process, spacer structures 149 and barrier structures 129 may be formed through semiconductor layer 120 in the same process and include the same material, such as silicon oxide.

As shown in FIG. 1A, 3D memory device 100 also includes a variety of local contacts (also known as "C1") as part of the interconnect structure, which are in contact with a structure in memory stack 114 directly. In some embodiments, the local contacts include channel local contacts 150 each below and in contact with the lower end of respective channel structure 124. Each channel local contact 150 can be electrically connected to a bit line contact (not shown) for bit line fan-out. In some embodiments, the local contacts further include word line local contacts 152 each below and in contact with respective stack conductive layer 116 (including a word line) at the staircase structure of memory stack 114 for word line fan-out. Local contacts, such as channel local contacts 150 and word line local contacts 152, can be electrically connected to peripheral circuits 108 of first semiconductor structure 102 through at least bonding layers 112 and 110. Local contacts, such as channel local contacts 150 and word line local contacts 152, each can include one or more conductive layers, such as a metal layer (e.g., W, Co, Cu, or Al) or a silicide layer surrounded by an adhesive/barrier layer (e.g., TiN).

Figure 1B:
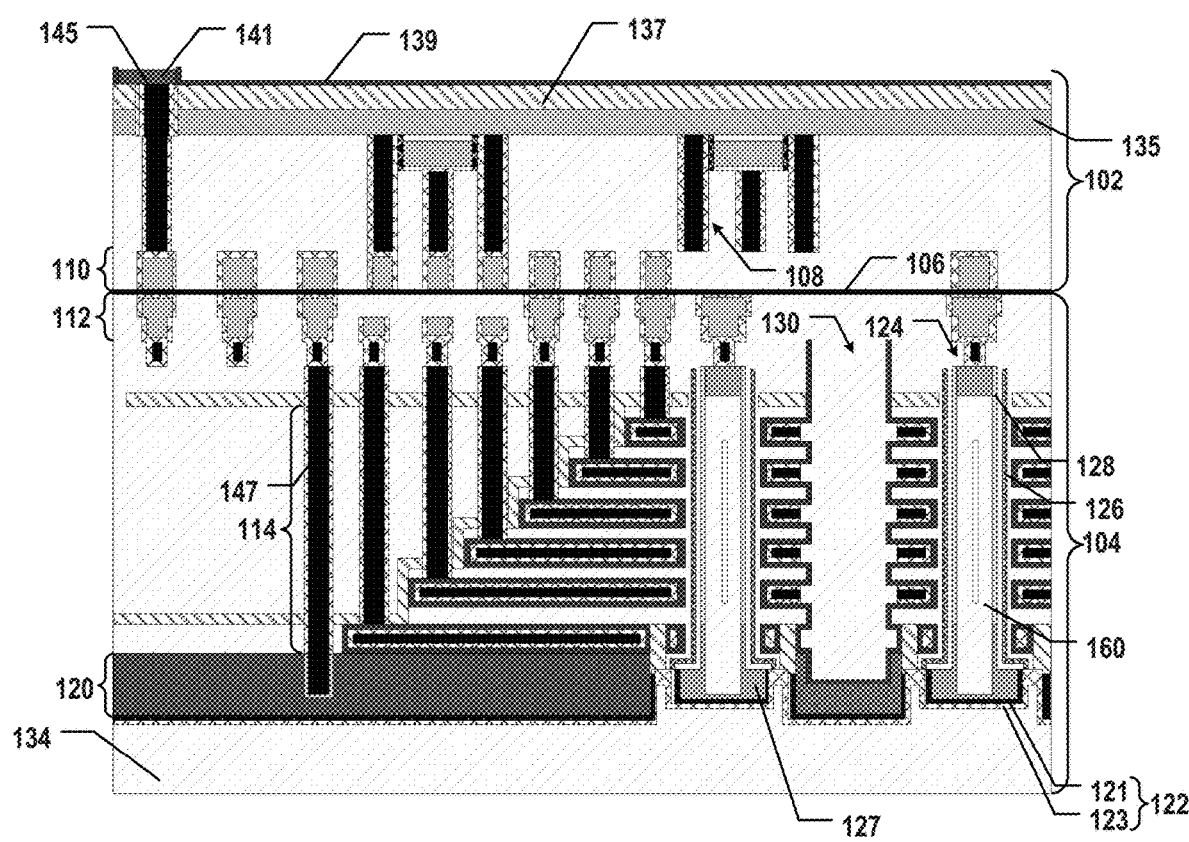
FIG. 1B illustrates a side view of a cross-section of another exemplary 3D memory device, according to some embodiments of the present disclosure.

FIG. 1B illustrates a side view of a cross-section of another exemplary 3D memory device 103, according to some embodiments of the present disclosure. Similar to 3D memory device 100 described above in FIG. 1A, 3D memory device 103 represents an example of a bonded 3D memory device in which first semiconductor structure 102 including peripheral circuits 108 and second semiconductor structure 104 including memory stack 114 and channel structures 124 are formed separately and bonded in a face-to-face manner at bonding interface 106. Different from 3D memory device 100 in FIG. 1A in which first semiconductor structure 102 including peripheral circuits 108 is below second semiconductor structure 104 including memory stack 114 and channel structures 124, 3D memory device 103 in FIG. 1B includes second semiconductor structure 104 disposed above first semiconductor structure 102. It is understood that the details of other same structures in both 3D memory devices 103 and 100 may not be repeated for ease of description.

As shown in FIG. 1B, second semiconductor structure 104 includes memory stack 114 including interleaved stack conductive layers 116 and stack dielectric layers 118, according to some embodiments. In some embodiments, second semiconductor structure 104 also includes semiconductor layer 120 below and in contact with memory stack 114. Semiconductor layer 120 can include N-type doped polysilicon to reduce the resistance thereof. As shown in FIG. 1B, second semiconductor structure 104 of 3D memory device 103 can further include channel structures 124 each extending vertically through memory stack 114 into semiconductor layer 120. Channel structure 124 can include memory film 126 and semiconductor channel 128. In some embodiments, the lateral dimension of first portion 124-1 of channel structure 124 facing semiconductor layer 120 is greater than the lateral dimension of second portion 124-2 of channel structure 124 facing memory stack 114, according to some embodiments. First portion 124-1 of channel structure 124 can include enlarging structure 127 in contact with semiconductor channel 128. In some embodiments, the doping concentration of part of semiconductor channel 128 in first portion 124-1 of channel structure 124 is greater than the doping concentration of part of semiconductor channel 128 in second portion 124-2 of channel structure 124.

As shown in FIG. 1B, second semiconductor structure 104 can further include conductive layer 122 below and in contact with semiconductor layer 120 and the doped part of semiconductor channel 128 in first portion 124-1 of channel structure 124. In some embodiments, conductive layer 122 includes metal silicide layer 121 below and in contact with semiconductor layer 120 and the doped part of semiconductor channel 128, and metal layer 123 below and in contact with metal silicide layer 121. In some embodiments, second semiconductor structure 104 can further include insulating structure 130 extending vertically through memory stack 114 into semiconductor layer 120.

As shown in FIG. 1B, backside source contact 132 in 3D memory device 100 is replaced by a front side source contact 147 in 3D memory device 103, according to some embodiments. Source contact 147 can be above and in contact with semiconductor layer 120, and source contact 147 and insulating structure 130 can be disposed on the same side, e.g., the front side, of semiconductor layer 120. In some embodiments, semiconductor layer 120 includes N-type doped polysilicon to reduce the resistance thereof. As a result, front side source contact 147 can be electrically connected to the source of the NAND memory string, e.g., the doped part of semiconductor channel 128 in first portion 124-1 of channel structure 124, through semiconductor layer 120 and conductive layer 122.

As shown in FIG. 1B, first semiconductor structure 102 of 3D memory device 103 can include peripheral circuits 108 above memory stack 114 in second semiconductor structure 104, and a semiconductor layer 135 (e.g., a thinned substrate) above peripheral circuits 108. In some embodiments, first semiconductor structure 102 also includes an ILD layer 137 on semiconductor layer 135 and a passivation layer 139 on ILD layer 137 for insulation and protection. First semiconductor structure 102 can further include a contact pad 141 above semiconductor layer 135 and ILD layer 137 for pad-out, e.g., transferring electrical signals between 3D memory device 103 and external circuits. In some embodiments, first semiconductor structure 102 further includes a contact 145 (e.g., a through substrate contact (TSC)) through semiconductor layer 135 and ILD layer 137 to be in contact with contact pad 141.

Although two exemplary 3D memory devices 100 and 103 are shown in FIGS. 1A and 1B, it is understood that by varying the relative positions of first and second semiconductor structures 102 and 104, the usage of front side source contact 147 or backside source contact 132, and/or the pad-out locations (e.g., through first semiconductor structure 102 and/or second semiconductor structure 104), any other suitable architectures of 3D memory devices may be applicable in the present disclosure without further detailed elaboration.

FIGS. 3A-3L illustrate a fabrication process for forming an exemplary 3D memory device, according to some embodiments of the present disclosure. FIG. 4 illustrates a flowchart of a method 400 for forming an exemplary 3D memory device, according to some embodiments of the present disclosure. Examples of the 3D memory device depicted in FIGS. 3A-3L and 4 include 3D memory device 100 depicted in FIG. 1A. FIGS. 3A-3L and 4 will be described together. It is understood that the operations shown in method 400 are not exhaustive and that other operations can be performed as well before, after, or between any of the illustrated operations. Further, some of the operations may be performed simultaneously, or in a different order than shown in FIG. 4.

Referring to FIG. 4, method 400 starts at operation 402, in which a peripheral circuit is formed on a first substrate. The first substrate can be a silicon substrate. As illustrated in FIG. 3I, a plurality of transistors are formed on a silicon substrate 350 using a plurality of processes including, but not limited to, lithography, etching, thin film deposition, thermal growth, implantation, chemical mechanical polishing (CMP), and any other suitable processes. In some embodiments, doped regions (not shown) are formed in silicon substrate 350 by ion implantation and/or thermal diffusion, which function, for example, as source regions and/or drain regions of the transistors. In some embodiments, isolation regions (e.g., STIs) are also formed in silicon substrate 350 by wet etching and/or dry etching and thin film deposition. The transistors can form peripheral circuits 352 on silicon substrate 350.

As illustrated in FIG. 3I, a bonding layer 348 is formed above peripheral circuits 352. Bonding layer 348 can include bonding contacts electrically connected to peripheral circuits 352. To form bonding layer 348, an ILD layer is deposited using one or more thin film deposition processes, such as chemical vapor deposition (CVD), physical vapor deposition (PVD), atomic layer deposition (ALD), or any combination thereof; the bonding contacts through the ILD layer are formed using wet etching and/or dry etching, e.g., reactive ion etching (RIE), followed by one or more thin film deposition processes, such as ALD, CVD, PVD, any other suitable processes, or any combination thereof.

Method 400 proceeds to operation 404, as illustrated in FIG. 4, in which a semiconductor layer is formed above a second substrate, and a stack structure is formed above the semiconductor layer. The semiconductor layer and stack structure can be formed on the front side of the second substrate on which semiconductor devices can be formed. The second substrate can be a silicon substrate. It is understood that since the second substrate will be removed from the final product, the second substrate may be part of a dummy wafer, for example, a carrier substrate, made of any suitable materials, such as glass, sapphire, plastic, silicon, to name a few, to reduce the cost of the second substrate. In some embodiments, the substrate is a carrier substrate. In some embodiments, the semiconductor layer includes N-type doped polysilicon, and the stack structure includes a dielectric stack having interleaved stack dielectric layers and stack sacrificial layers. It is understood that in some examples, the stack structure may include a memory stack having interleaved stack dielectric layers (e.g., silicon oxide layers) and stack conductive layers (e.g., polysilicon layers).

In some embodiments, a first isolation layer is formed between the second substrate and the semiconductor layer, and a second isolation layer is formed between the semiconductor layer and the stack structure. That is, the semiconductor layer can be sandwiched between the first and second isolation layers. The first and second isolation layers can include silicon oxynitride or silicon nitride. In some embodiments, a barrier structure extending vertically through the second isolation layer and the semiconductor layer is formed. In some embodiments, a sacrificial layer is formed between the second substrate and the first isolation layer. The sacrificial layer can include two pad oxide layers (also known as buffer layers) and a stop layer sandwiched between the two pad oxide layers. In some embodiments, the stop layer includes silicon oxynitride or silicon nitride, and each of the two pad oxide layers includes silicon oxide.

As illustrated in FIG. 3A, a sacrificial layer 303 is formed on a carrier substrate 302, a first isolation layer 305 is formed on sacrificial layer 303, an N-type doped semiconductor layer 306 is formed on first isolation layer 305, and a second isolation layer 307 is formed on N-type doped semiconductor layer 306. N-type doped semiconductor layer 306 can include polysilicon doped with N-type dopant(s), such as P, As, or Sb. Sacrificial layer 303 can include any suitable sacrificial materials that can be later selectively removed and are different from the material of carrier substrate 302. In some embodiments, sacrificial layer 303 is a composite dielectric layer having a stop layer 304 sandwiched between two pad oxide layers. As described below in detail, stop layer 304 can act as a CMP/etch stop layer when removing carrier substrate 302 from the backside and thus can include any suitable materials other than the material of carrier substrate 302, such as silicon nitride or silicon oxynitride. Isolation layers 305 and 307 sandwiching N-type doped semiconductor layer 306 can act as an etch stop layers when etching the channel holes from the front side and thus can include any suitable materials that have a high etching selectivity (e.g., greater than about 5) with respect to polysilicon (the material of N-type doped semiconductor layer 306), such as silicon nitride or silicon oxynitride. It is understood that in some examples, pad oxide layers (e.g., silicon oxide layers) may be formed between carrier substrate 302 and stop layer 304 and between stop layer 304 and first isolation layer 305 to relax the stress between different layers and avoid peeling.

To form sacrificial layer 303, silicon oxide, silicon nitride or silicon oxynitride, and silicon oxide are sequentially deposited on carrier substrate 302 using one or more thin film deposition processes including, but not limited to, CVD, PVD, ALD, or any combination thereof, according to some embodiments. To form first isolation layer 305, silicon nitride or silicon oxynitride is deposited on sacrificial layer 303 using one or more thin film deposition processes including, but not limited to, CVD, PVD, ALD, or any combination thereof, according to some embodiments. In some embodiments, to form N-type doped semiconductor layer 306, polysilicon is deposited on first isolation layer 305 using one or more thin film deposition processes including, but not limited to, CVD, PVD, ALD, or any combination thereof, followed by doping the deposited polysilicon with N-type dopant(s), such as P, As, or Sb, using ion implantation and/or thermal diffusion. In some embodiments, to form N-type doped semiconductor layer 306, in-situ doping of N-type dopants, such as P, As, or Sb, is performed when depositing polysilicon on first isolation layer 305. To form second isolation layer 307, silicon nitride or silicon oxynitride is deposited on N-type doped semiconductor layer 306 using one or more thin film deposition processes including, but not limited to, CVD, PVD, ALD, or any combination thereof, according to some embodiments.

As illustrated in FIG. 3B, barrier structures 309 extending vertically through second isolation layer 307 and N-type doped semiconductor layer 306 are formed. In some embodiments, barrier structures 309 extend further into or through first isolation layer 305 as well. To form barrier structures 309, barrier openings (not shown) are first patterned using lithography and etched through second isolation layer 307 and N-type doped semiconductor layer 306 using wet etching and/or dry etching, such as deep RIE (DRIE), followed by depositing a layer of dielectric, such as silicon oxide, to fill the barrier opening using one or more thin film deposition processes including, but not limited to, CVD, PVD, ALD, or any combination thereof. A CMP process can be performed to remove the excess dielectric layer on second isolation layer 307 to planarize barrier structures 309. In some embodiments, spacer structures 311 are formed in the same process for forming barrier structures 309. Barrier structures 309 can be patterned and formed in the core array region in which channel structures are to be formed, while spacer structures 311 can be patterned and formed in the peripheral region in which peripheral contacts are to be formed.

As illustrated in FIG. 3C, a dielectric stack 308 including a plurality pairs of a first dielectric layer (referred to herein as "stack sacrificial layer" 312) and a second dielectric layer (referred to herein as "stack dielectric layers" 310, together referred to herein as "dielectric layer pairs") is formed on second isolation layer 307 above N-type doped semiconductor layer 306. Dielectric stack 308 includes interleaved stack sacrificial layers 312 and stack dielectric layers 310, according to some embodiments. Stack dielectric layers 310 and stack sacrificial layers 312 can be alternatingly deposited on second isolation layer 307 to form dielectric stack 308. In some embodiments, each stack dielectric layer 310 includes a layer of silicon oxide, and each stack sacrificial layer 312 includes a layer of silicon nitride. Dielectric stack 308 can be formed using one or more thin film deposition processes including, but not limited to, CVD, PVD, ALD, or any combination thereof. As illustrated in FIG. 3C, a staircase structure can be formed on the edge of dielectric stack 308. The staircase structure can be formed by performing a plurality of so-called "trim-etch" cycles to the dielectric layer pairs of dielectric stack 308 toward carrier substrate 302. Due to the repeated trim-etch cycles applied to the dielectric layer pairs of dielectric stack 308, dielectric stack 308 can have one or more tilted edges and a top dielectric layer pair shorter than the bottom one, as shown in FIG. 3C.

Figure 4:
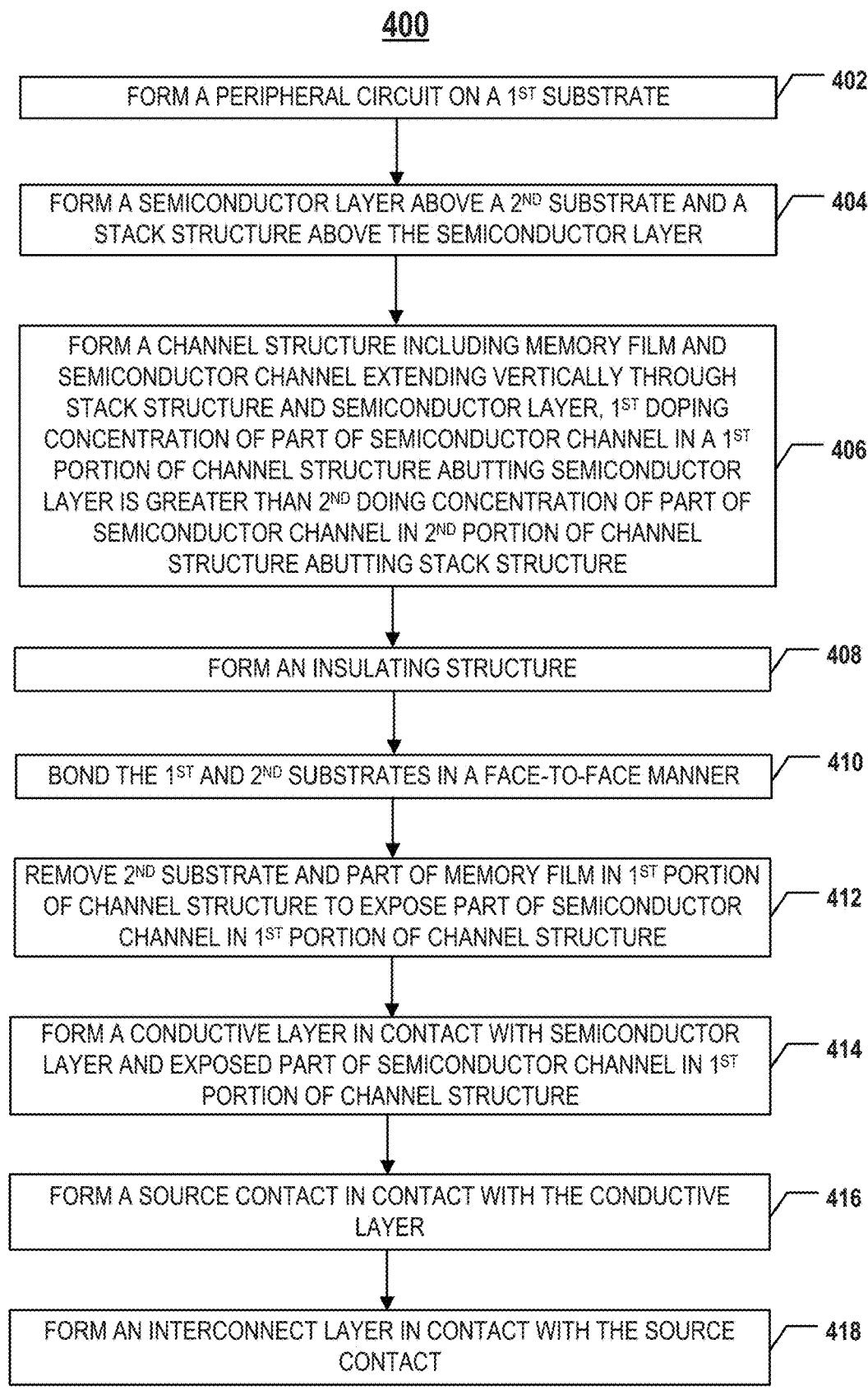
FIG. 4 illustrates a flowchart of an exemplary method for forming a 3D memory device, according to some embodiments of the present disclosure.
Figure 5:
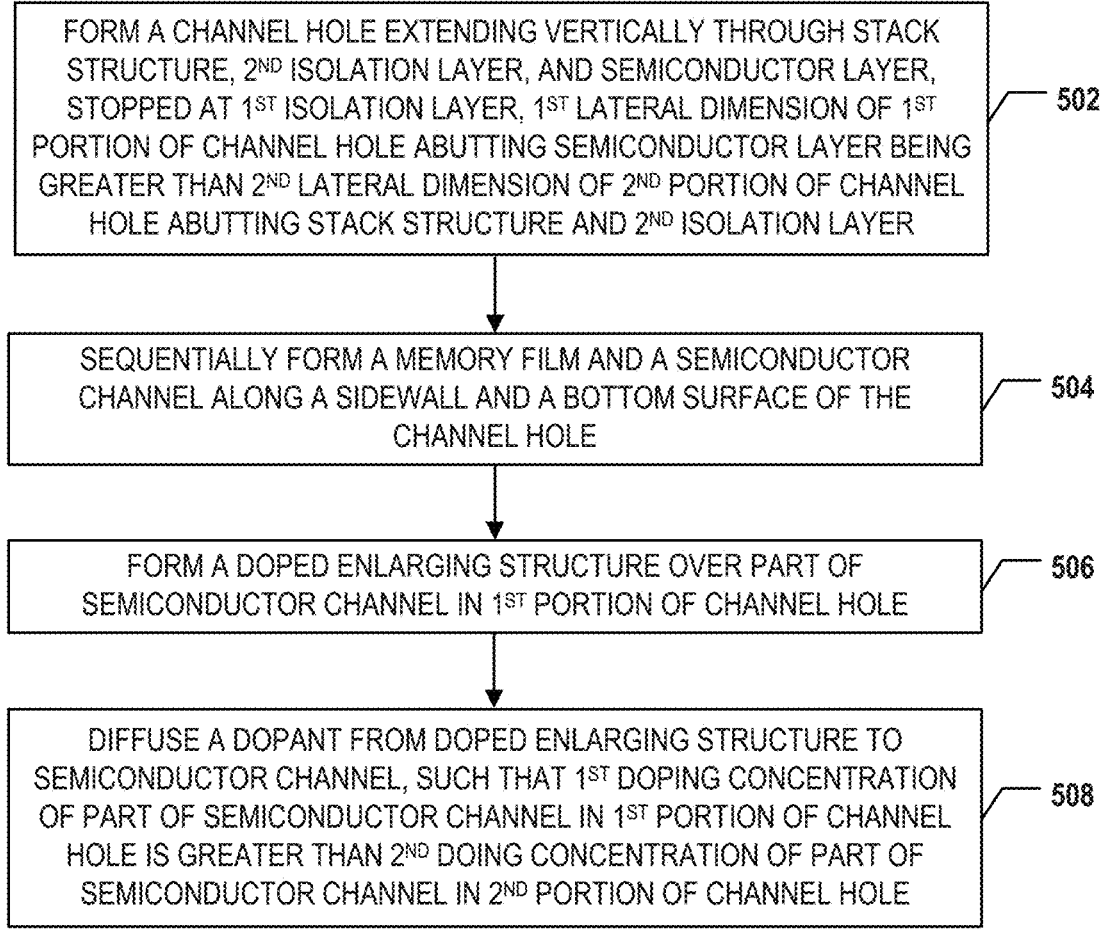
FIG. 5 illustrates a flowchart of an exemplary method for forming a channel structure in a 3D memory device, according to some embodiments of the present disclosure.

Method 400 proceeds to operation 406, as illustrated in FIG. 4, in which a channel structure extending vertically through the stack structure and the semiconductor layer is formed. The channel structure can include a memory film and a semiconductor channel. In some embodiments, a first doping concentration of part of the semiconductor channel in a first portion of the channel structure facing the semiconductor layer is greater than a second doping concentration of part of the semiconductor channel in a second portion of the channel structure facing the stack structure. For example, FIG. 5 illustrates a flowchart of an exemplary method 500 for forming a channel structure in a 3D memory device, according to some embodiments of the present disclosure. At operation 502, a channel hole extending vertically through the stack structure, the second isolation layer, and the semiconductor layer is formed, stopped at the first isolation layer. In some embodiments, a first lateral dimension of a first portion of the channel hole facing the semiconductor layer is greater than a second lateral dimension of a second portion of the channel hole facing the stack structure and the second isolation layer. To form the channel hole, the channel hole extending vertically through the stack structure, the second isolation layer, and the semiconductor layer is etched, stopped at the first isolation layer, and the etching of the first portion of the channel hole is laterally stopped by the barrier structure, according to some embodiments.

As illustrated in FIG. 3D, a channel hole 313 is an opening extending vertically through dielectric stack 308, second isolation layer 307, and N-type doped semiconductor layer 306, stopping at first isolation layer 305. In some embodiments, a plurality of openings are formed, such that each opening becomes the location for growing an individual channel structure 314 in the later process. Each channel hole 313 can be aligned laterally with a respective barrier structure 309 and include a first portion 313-1 facing N-type doped semiconductor layer 306 and a second portion 313-2 facing second isolation layer 307 and dielectric stack 308. As shown in FIG. 3D, the dimensions of first portion 313-1 of channel hole 313 can be defined vertically by first and second isolation layers 305 and 307 (which stop the etching of N-type doped semiconductor layer 306 in the vertical direction) and defined laterally by barrier structure 309 (which stops the etching of N-type doped semiconductor layer 306 in the lateral direction). In some embodiments, the lateral dimension (e.g., the inner diameter) of barrier structure 309 is greater than that of second portion 313-2 of channel hole 313, such that the lateral dimension (e.g., the diameter) of first portion 313-1 is greater than the lateral dimension (e.g., the diameter) of second portion 313-2 of channel hole 313.

In some embodiments, fabrication processes for forming channel holes 313 include wet etching and/or dry etching, such as DRIE. The etching of channel holes 313 continues until reaching first isolation layer 305, according to some embodiments. In some embodiments, the etching conditions, such as etching rate and time, can be controlled to ensure that each channel hole 313 has reached and stopped at first isolation layer 305 to minimize the gouging variations among channel holes 313. In some embodiments, a second etching process is applied to laterally expand and enlarge first portion 313-1 of channel hole 313 that faces N-type doped semiconductor layer 306. For example, a wet etching process may be used by applying a wet etchant including tetramethylammonium hydroxide (TMAH) through channel hole 313 to selectively etch N-type doped semiconductor layer 306 (e.g., including polysilicon) without damaging dielectric stack 308 and first and second isolation layers 305 and 307, which include materials other than that of N-type doped semiconductor layer 306. The wet etching of N-type doped semiconductor layer 306 may be laterally stopped by barrier structure 309 (e.g., including silicon oxide). It is understood that in some examples, barrier structure 309 may not be formed, and the second etching process may be controlled (e.g., by controlling the etch time and/or etch rate) to enlarge and expand first portion 313-1 of channel hole 313 to a desired degree. Nevertheless, after the etching processes, channel hole 313 includes two portions 313-1 and 313-2 with different lateral dimensions, according to some embodiments.

Referring to FIG. 5, at operation 504, a memory film and a semiconductor channel are sequentially formed along a sidewall and a bottom surface of the channel hole. In some embodiments, to sequentially form the memory film and the semiconductor channel, layers of silicon oxide, silicon nitride, silicon oxide, and intrinsic polysilicon are sequentially deposited.

Figure 3E:
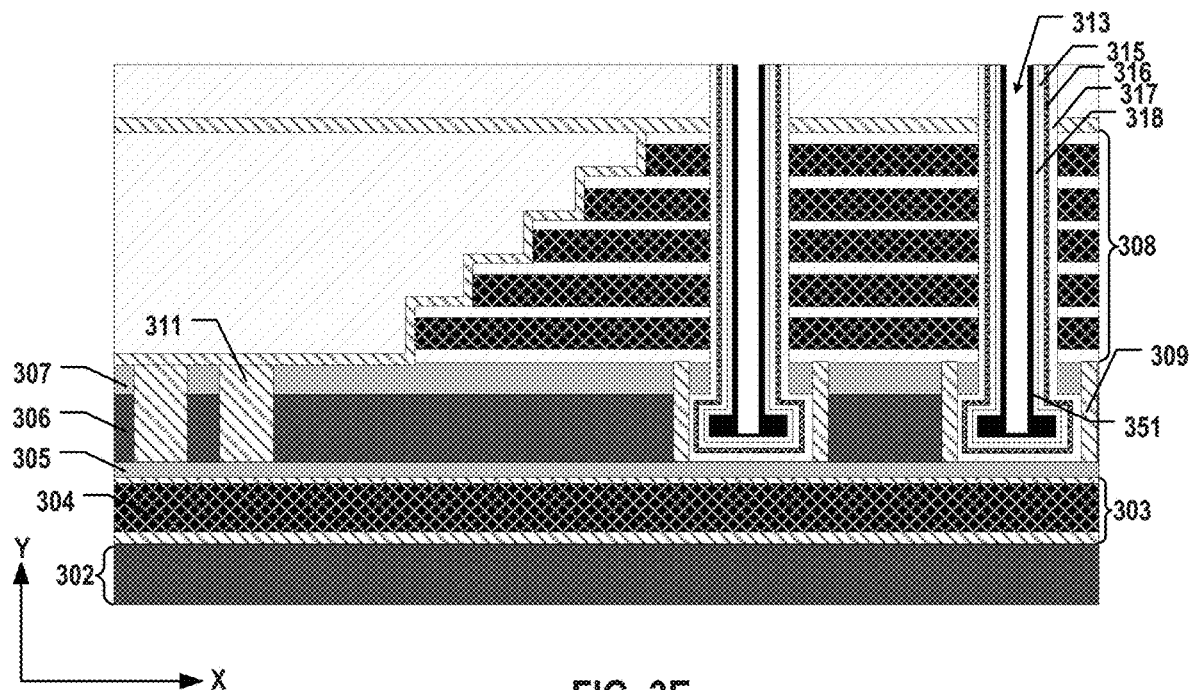

As illustrated in FIG. 3E, a memory film including a blocking layer 317, a storage layer 316, and a tunneling layer 315, and a semiconductor channel 318 are sequentially formed in this order along the sidewall and the bottom surface of channel hole 313. In some embodiments, blocking layer 317, storage layer 316, and tunneling layer 315 are first deposited along the sidewall and bottom surface of channel hole 313 in this order using one or more thin film deposition processes, such as ALD, CVD, PVD, any other suitable processes, or any combination thereof, to form the memory film. Semiconductor channel 318 then can be formed by depositing a semiconductor material, such as intrinsic polysilicon (pure, undoped polysilicon), over tunneling layer 315 using one or more thin film deposition processes, such as ALD, CVD, PVD, any other suitable processes, or any combination thereof. In some embodiments, a first silicon oxide layer, a silicon nitride layer, a second silicon oxide layer, and a polysilicon layer (a "SONO" structure) are sequentially deposited to form blocking layer 317, storage layer 316, and tunneling layer 315 of the memory film and semiconductor channel 318.

Referring to FIG. 5, at operation 506, a doped enlarging structure is formed over the part of the semiconductor channel in the first portion of the channel hole. In some embodiments, to form the doped enlarged structure, a layer of polysilicon or silicon oxide is deposited over the semiconductor channel in the channel hole, the layer of polysilicon or silicon oxide is in situ doped with the dopant, and part of the layer of polysilicon or silicon oxide over the semiconductor channel in the second portion of the channel hole is etched. In some embodiments, the dopant is an N-type dopant, and a third doping concentration of the doped enlarging structure is between about $10^{21}$ cm$^{-3}$ and about $10^{22}$ cm$^{-3}$.

As illustrated in FIG. 3E, a layer 351 of polysilicon or silicon oxide is deposited over semiconductor channel 318 in channel hole 313 using one or more thin film deposition processes, such as ALD, CVD, PVD, any other suitable processes, or any combination thereof. As shown in FIG. 3E, the deposition of layer 351 can be controlled, such that layer 351 is deposited over the part of semiconductor channel 318 in first portion 313-1 (e.g., in FIG. 3D) of channel hole 313, and that layer 351 deposited over the sidewall of second portion 313-2 (e.g., in FIG. 3D) of channel hole 313 does not seal channel hole 313. Layer 351 can be doped with N-type dopant(s), such as P, As, or Sb, using ion implantation and/or thermal diffusion. In some embodiments, to form doped layer 351, in-situ doping of N-type dopants, such as P, As, or Sb, is performed when depositing layer 351 of polysilicon or silicon oxide over semiconductor channel 318 in channel hole 313, such as CVD. In some embodiments, the doping concentration (i.e., the initial doping concentration) of layer 351 is between about $10^{21}$ cm$^{-3}$ and about $10^{22}$ cm$^{-3}$, such as between $10^{21}$ cm$^{-3}$ and $10^{22}$ cm$^{-3}$ (e.g., $10^{21}$ cm$^{-3}$, $2\times10^{21}$ cm$^{-3}$, $3\times10^{21}$ cm$^{-3}$, $4\times10^{21}$ cm$^{-3}$, $5\times10^{21}$ cm$^{-3}$, $6\times10^{21}$ cm$^{-3}$, $7\times10^{21}$ cm$^{-3}$, $8\times10^{21}$ cm$^{-3}$, $9\times10^{21}$ cm$^{-3}$, $10^{22}$ cm$^{-3}$, any range bounded by the lower end by any of these values, or in any range defined by any two of these values).

Figure 3F:
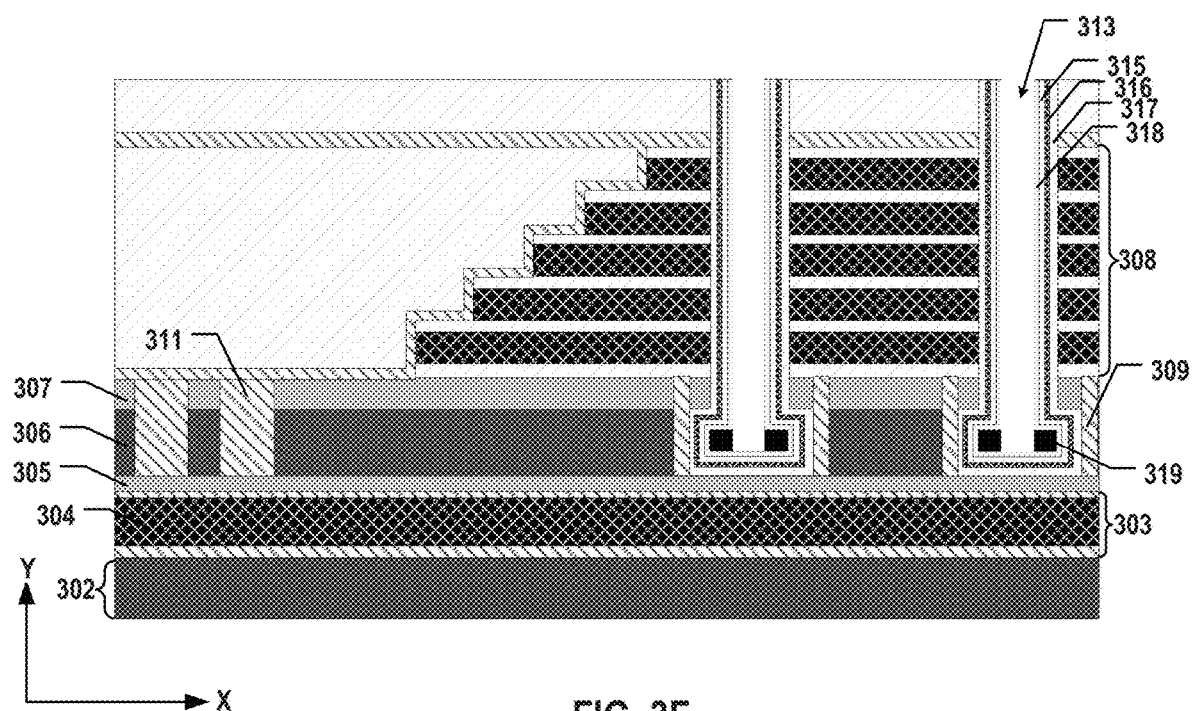

As illustrated in FIG. 3F, part of layer 351 along the sidewall of channel hole 313 (e.g., in second portion 313-2) is removed, for example, using wet etching or dry etching. In some embodiments, a wet etching process is used by applying, through channel hole 313, a wet etchant including TMAH to selectively etch the part of layer 351 of polysilicon or a wet etchant including hydrofluoric acid to selectively etch the part of layer 351 of silicon oxide. It is understood that the etching may remove part of layer 351 in first portion 313-1 of channel hole 313 as well. Nevertheless, after etching, the remainder of layer 351 in contact with semiconductor channel 318 in first portion 313-1 of channel hole 313 becomes a doped enlarging structure 319, as shown in FIG. 3F, according to some embodiments. The initial doping concentration of doped enlarging structure 319 can be the same as the initial doping concentration of doped layer 351.

Referring to FIG. 5, at operation 508, a dopant is diffused from the doped enlarging structure to the semiconductor channel, such that the first doping concentration of the part of the semiconductor channel in the first portion of the channel hole is greater than the second doping concentration of the part of the semiconductor channel in the second portion of the channel hole.

During any thermal processes after the formation of doped enlarging structure 319, the dopants (e.g., P, As, or Sb) can be diffused from doped enlarging structure 319 to semiconductor channel 318 to partially in situ dope semiconductor channel 318 (e.g., including intrinsic polysilicon) with the same dopants in doped enlarging structure 319. In some embodiments, since doped enlarging structure 319 is in contact with only the part of semiconductor channel 318 in first portion 313-1 of channel hole 313, but not another part of semiconductor channel 318 in second portion 313-2 of channel hole 313, the doping concentration of the part of semiconductor channel 318 in first portion 313-1 of channel hole 313 is greater than the doping concentration of the part of semiconductor channel 318 in second portion 313-2 of channel hole 313. It is understood that depending on the initial doping concentration of doped enlarging structure 319, the conditions of the thermal processes, the structures of semiconductor channel 318 and doped enlarging structure 319, etc., the doping concentration profile after the diffusion may vary in different examples. Nevertheless, the intrinsic polysilicon of semiconductor channel 318 in first portion 313-1 of channel hole 313 can become doped polysilicon (e.g., shown in FIG. 3G), for example, having a doping concentration (after diffusion) between about $10^{19}$ cm$^{-3}$ and about $10^{21}$ cm$^{-3}$, such as between $10^{19}$ cm$^{-3}$ and $10^{21}$ cm$^{-3}$. In the meanwhile, the partial in situ doping of semiconductor channel 318 may not alter the intrinsic nature of another part of semiconductor channel 318 in second portion 313-2 of channel hole 313 to be formed as part of the memory cells, according to some embodiments. The doping concentration of doped enlarging structure 319 may decrease from its initial doping concentration after diffusion but may still be greater than the doping concentration of the part of semiconductor channel 318 in second portion 313-2 of channel hole 313 due to the residual dopant in doped enlarging structure 319.

It is understood that no additional thermal process may be added to the fabrication process flow to diffuse the dopant from doped enlarging structure 319 to semiconductor channel 318. Instead, any existing processes after the formation of doped enlarging structure 319 in the existing fabrication process flow may cause the diffusion of the dopant, such as the various processes described below for illustrative purposes only.

Figure 3G:
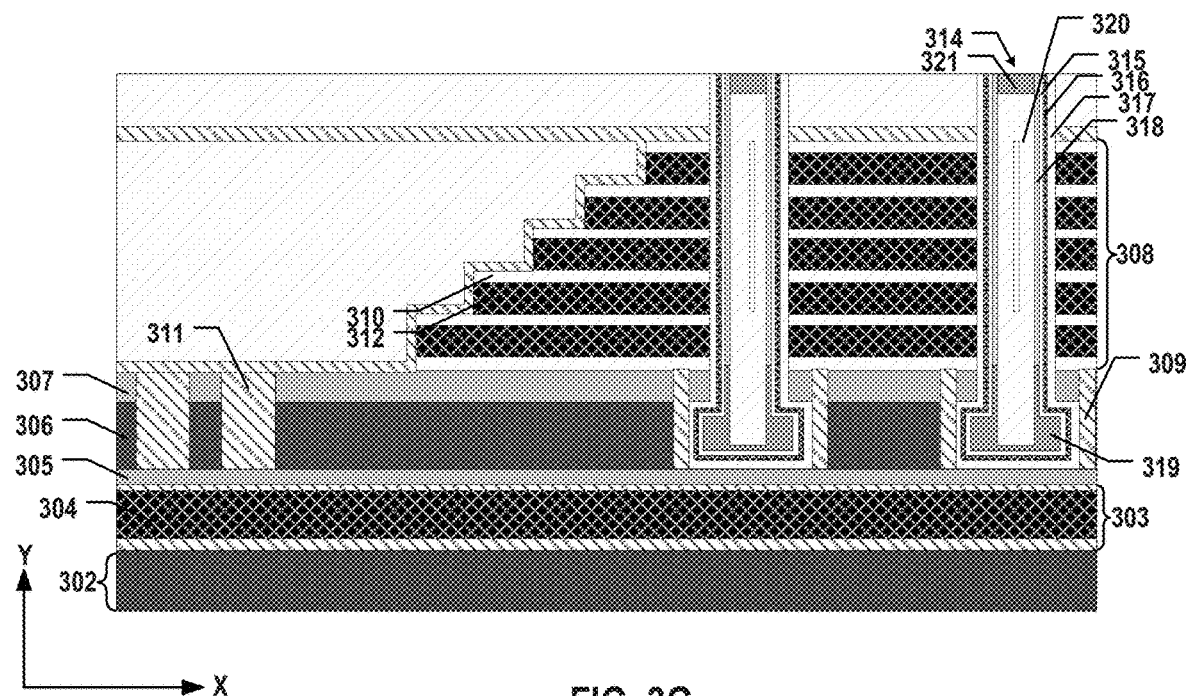

As illustrated in FIG. 3G, a capping layer 320 is formed in channel hole 313 and over semiconductor channel 318 and doped enlarging structure 319 to completely or partially fill channel hole 313 (e.g., without or with an air gap). Capping layer 320 can be formed by depositing a dielectric material, such as silicon oxide, using one or more thin film deposition processes, such as ALD, CVD, PVD, any other suitable processes, or any combination thereof. A channel plug 321 can then be formed in the top portion of channel hole 313 (e.g., shown in FIG. 3F). In some embodiments, parts of the memory film, semiconductor channel 318, and capping layer 320 that are on the top surface of dielectric stack 308 are removed and planarized by CMP, wet etching, and/or dry etching. A recess (not shown) then can be formed in the upper end of channel hole 313 by wet etching and/or drying etching part of capping layer 320. Channel plug 321 can then be formed by depositing semiconductor materials, such as polysilicon, into the recess using one or more thin film deposition processes, such as CVD, PVD, ALD, or any combination thereof. Channel structure 314 is thereby formed through dielectric stack 308 and second isolation layer 307, into N-type doped semiconductor layer 306, according to some embodiments. Channel structure 314 can include a first portion (corresponding to first portion 313-1 of channel hole 313) facing N-type doped semiconductor layer 306 and a second portion (corresponding to second portion 313-2 of channel hole 313) facing dielectric stack 308 and second isolation layer 307. The lateral dimension of the first portion can be greater than the lateral dimension of the second portion of channel structure 314.

Method 400 proceeds to operation 408, as illustrated in FIG. 4, in which an insulating structure is formed. In some embodiments, an opening extending vertically through the stack structure is formed, and the stack structure is replaced with a memory stack including interleaved stack conductive layer and stack dielectric layers through the opening, for example, using the so-called "gate replacement" process. The insulating structure can be formed in the opening. In some embodiments, to form the insulating structure, after forming the memory stack, one or more dielectric materials are deposited into the opening to fill the opening. It is understood that in some examples in which the stack structure is a memory stack, the gate-replacement process may be skipped.

Figure 3H:
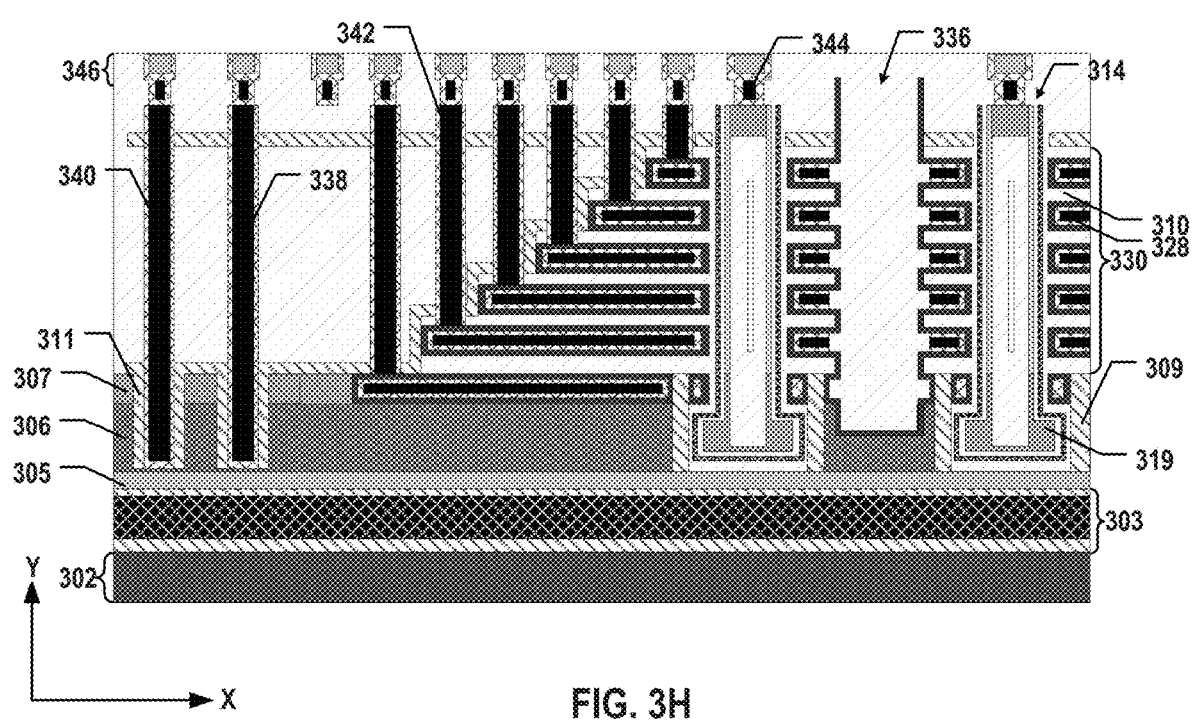
Figure 3I:
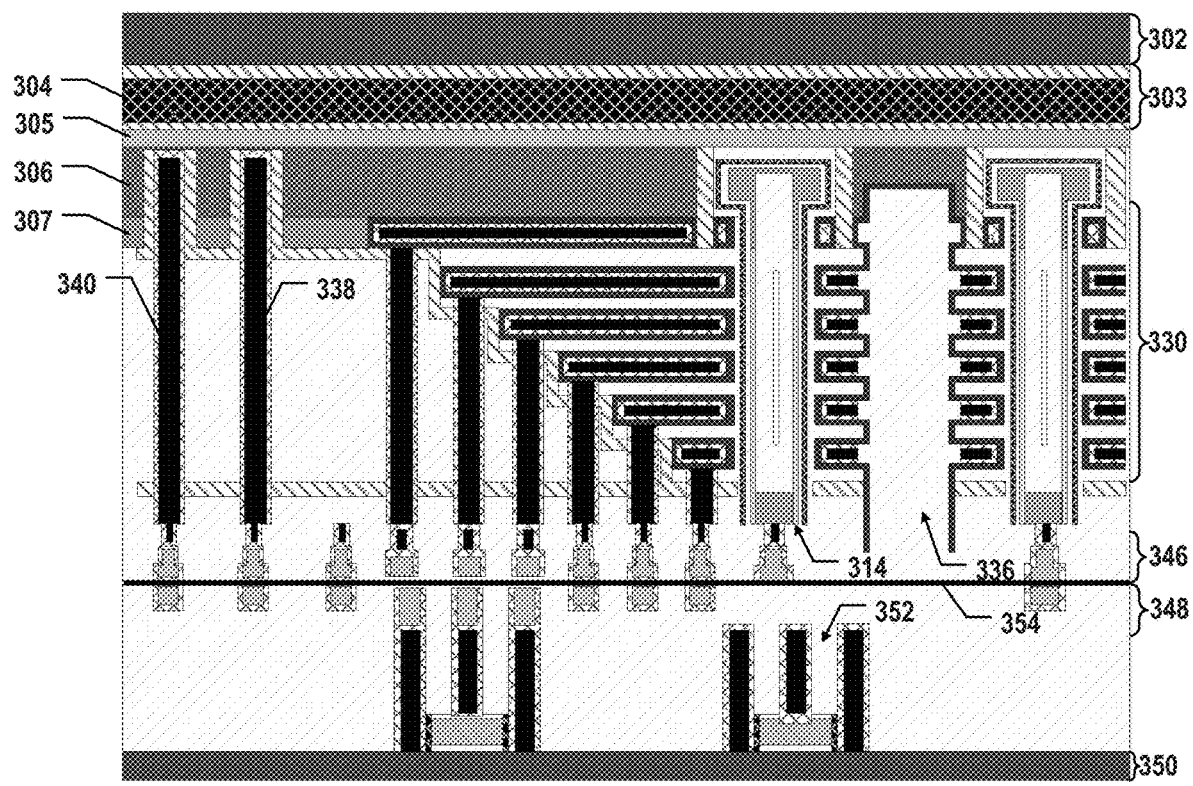

As illustrated in FIG. 3H, an insulating structure 336 extending vertically through memory stack 330 and into N-type doped semiconductor layer 306 is formed. In some embodiments, to form insulating structure 336, a slit (not shown), which is an opening that extends vertically through dielectric stack 308 and second isolation layer 307, is formed first. In some embodiments, fabrication processes for forming the slit include wet etching and/or dry etching, such as DRIE.

A gate replacement can then be performed through the slit to replace dielectric stack 308 with a memory stack 330. In some embodiments, lateral recesses (not shown) are first formed by removing stack sacrificial layers 312 (e.g., shown in FIG. 3G) through the slit. In some embodiments, stack sacrificial layers 312 are removed by applying etchants through the slit, creating the lateral recesses interleaved between stack dielectric layers 310. The etchants can include any suitable etchants that etch stack sacrificial layers 312 selective to stack dielectric layers 310. In some embodiments in which second isolation layer 307 and stack sacrificial layers 312 include the same material, for example, silicon nitride, at least part of second isolation layer 307 is removed as well to form a lateral recess. The stack conductive layers (including gate electrodes and adhesive layers) can then be deposited into the lateral recesses through the slit. In some embodiments, a gate dielectric layer is deposited into the lateral recesses prior to stack conductive layers 328, such that stack conductive layers 328 are deposited on the gate dielectric layer. Stack conductive layers 328, such as metal layers, can be deposited using one or more thin film deposition processes, such as ALD, CVD, PVD, any other suitable processes, or any combination thereof. In some embodiments, the gate dielectric layer, such as a high-k dielectric layer, is formed along the sidewall and the bottom surface of the slit as well. Memory stack 330 including interleaved stack conductive layers 328 and stack dielectric layers 310 is thereby formed, replacing dielectric stack 308 (e.g., shown in FIG. 3G), according to some embodiments. It is understood that in some examples, at least part of second isolation layer 307 may be replaced with stack conductive layer 328 to become part of memory stack 330.

Insulating structure 336 can then be formed by depositing one or more dielectric materials, such as silicon oxide, into the slit to fully or partially fill the slit (with or without an air gap) using one or more thin film deposition processes, such as ALD, CVD, PVD, any other suitable processes, or any combination thereof. In some embodiments, insulating structure 336 includes the gate dielectric layer (e.g., including high-k dielectrics) and a dielectric capping layer (e.g., including silicon oxide).

As illustrated in FIG. 3H, after the formation of insulating structure 336, local contacts, including channel local contacts 344 and word line local contacts 342, and peripheral contacts 338 and 340 are formed. A local dielectric layer can be formed on memory stack 330 by depositing dielectric materials, such as silicon oxide or silicon nitride, using one or more thin film deposition processes, such as CVD, PVD, ALD, or any combination thereof, on top of memory stack 330. Channel local contacts 344, word line local contacts 342, and peripheral contacts 338 and 340 can be formed by etching contact openings (not shown) through the local dielectric layer (and any other ILD layers) using wet etching and/or dry etching, e.g., RIE, followed by filling the contact openings with conductive materials using one or more thin film deposition processes, such as ALD, CVD, PVD, any other suitable processes, or any combination thereof. In some embodiments in which spacers structures 311 are formed in the same process for forming barrier structure 309, peripheral contacts 338 and 340 are patterned to be aligned with spacer structures 311, such that peripheral contacts 338 and 340 each extends vertically through spacer structures 311 to be electrically separated from surrounding N-type doped semiconductor layer 306.

Although not shown, it is understood that in some examples, a front side source contact (e.g., 147 in FIG. 1B) may be formed in the same processes for forming word line local contacts 342. The front side source contact can be in contact with N-type doped semiconductor layers 306.

As illustrated in FIG. 3H, a bonding layer 346 is formed above channel local contacts 344, word line local contacts 342, and peripheral contacts 338 and 340. Bonding layer 346 includes bonding contacts electrically connected to channel local contacts 344, word line local contacts 342, and peripheral contacts 338 and 340. To form bonding layer 346, an ILD layer is deposited using one or more thin film deposition processes, such as CVD, PVD, ALD, or any combination thereof, and the bonding contacts are formed through the ILD layer using wet etching and/or dry etching, e.g., RIE, followed by one or more thin film deposition processes, such as ALD, CVD, PVD, any other suitable processes, or any combination thereof.

Method 400 proceeds to operation 410, as illustrated in FIG. 4, in which the first substrate and the second substrate are bonded in a face-to-face manner. The bonding can include hybrid bonding. As illustrated in FIG. 3I, carrier substrate 302 and components formed thereon (e.g., memory stack 330 and channel structures 314 formed therethrough) are flipped upside down. Bonding layer 346 facing down is bonded with bonding layer 348 facing up, i.e., in a face-to-face manner, thereby forming a bonding interface 354 between carrier substrate 302 and silicon substrate 350, according to some embodiments. In some embodiments, a treatment process, e.g., a plasma treatment, a wet treatment, and/or a thermal treatment, is applied to the bonding surfaces prior to the bonding. After the bonding, the bonding contacts in bonding layer 346 and the bonding contacts in bonding layer 348 are aligned and in contact with one another, such that memory stack 330 and channel structures 314 formed therethrough can be electrically connected to peripheral circuits 352.

Method 400 proceeds to operation 412, as illustrated in FIG. 4, in which the second substrate and part of the memory film in the first portion of the channel structure are removed to expose the part of the semiconductor channel in the first portion of the channel structure. The removal can be performed from the backside of the second substrate. In some embodiments, the removal of the second substrate is stopped by the sacrificial layer.

Figure 3J:
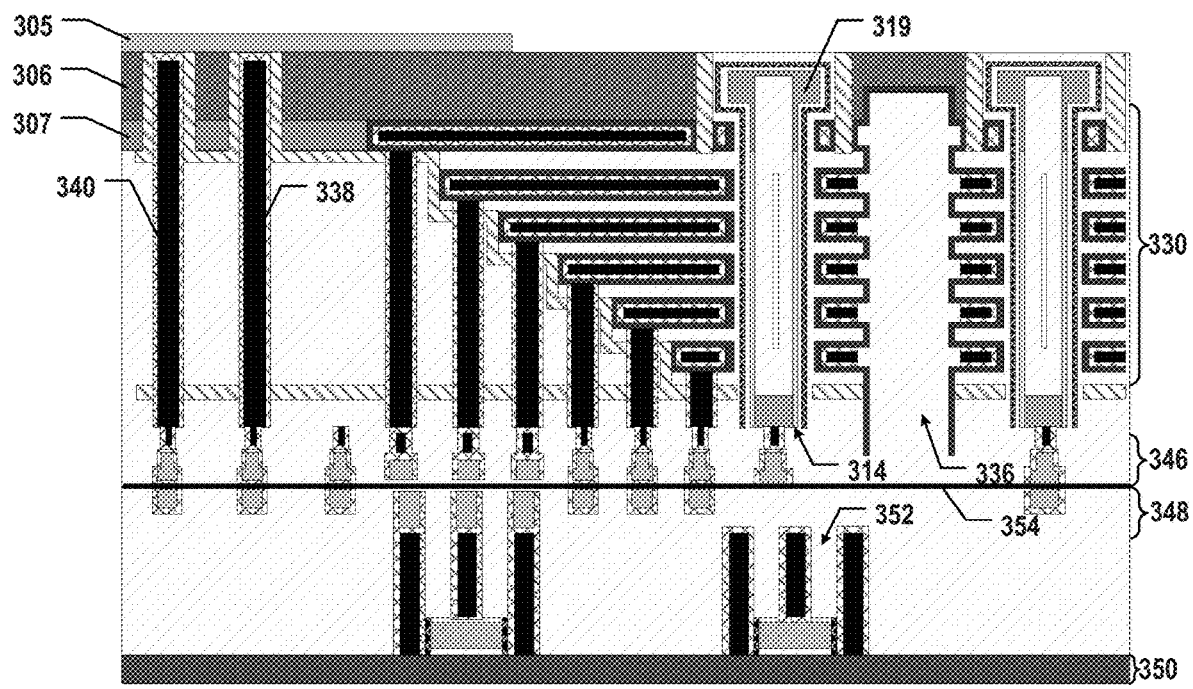

As illustrated in FIG. 3J, carrier substrate 302 (and the pad oxide layer between carrier substrate 302 and stop layer 304, shown in FIG. 3I) is completely removed from the backside until being stopped by stop layer 304 (e.g., a silicon nitride layer). Carrier substrate 302 can be completely removed using CMP, grinding, dry etching, and/or wet etching. In some embodiments, carrier substrate 302 is peeled off. In some embodiments in which carrier substrate 302 includes silicon and stop layer 304 includes silicon nitride, carrier substrate 302 is removed using silicon CMP, which can be automatically stopped when reaching stop layer 304 having materials other than silicon, i.e., acting as a backside CMP stop layer. In some embodiments, substrate 302 (a silicon substrate) is removed using wet etching by TMAH, which is automatically stopped when reaching stop layer 304 having materials other than silicon, i.e., acting as a backside etch stop layer. Stop layer 304 can ensure the complete removal of carrier substrate 302 without the concern of thickness uniformity after thinning.

As illustrated in FIG. 3J, the remainder of sacrificial layer 303 (e.g., stop layer 304 and another pad oxide layer between stop layer 304 and first isolation layer 305, shown in FIG. 3I) then can be completely removed as well using wet etching with suitable etchants, such as phosphoric acid and hydrofluoric acid, until being stopped by first isolation layer 305. In some embodiments, at least part of first isolation layer 305 (e.g., covering channel structures 314 and part of N-type doped semiconductor layer 306 in the core array region) can be removed as well using wet etching. As a result, the first portions of channel structures 314 and at least part of N-type doped semiconductor layer 306 can be exposed from the backside. In some embodiments, part of first isolation layer 305 (e.g., covering peripheral contacts 340 and 338 in the peripheral region) remains intact after etching.

Figure 3K:
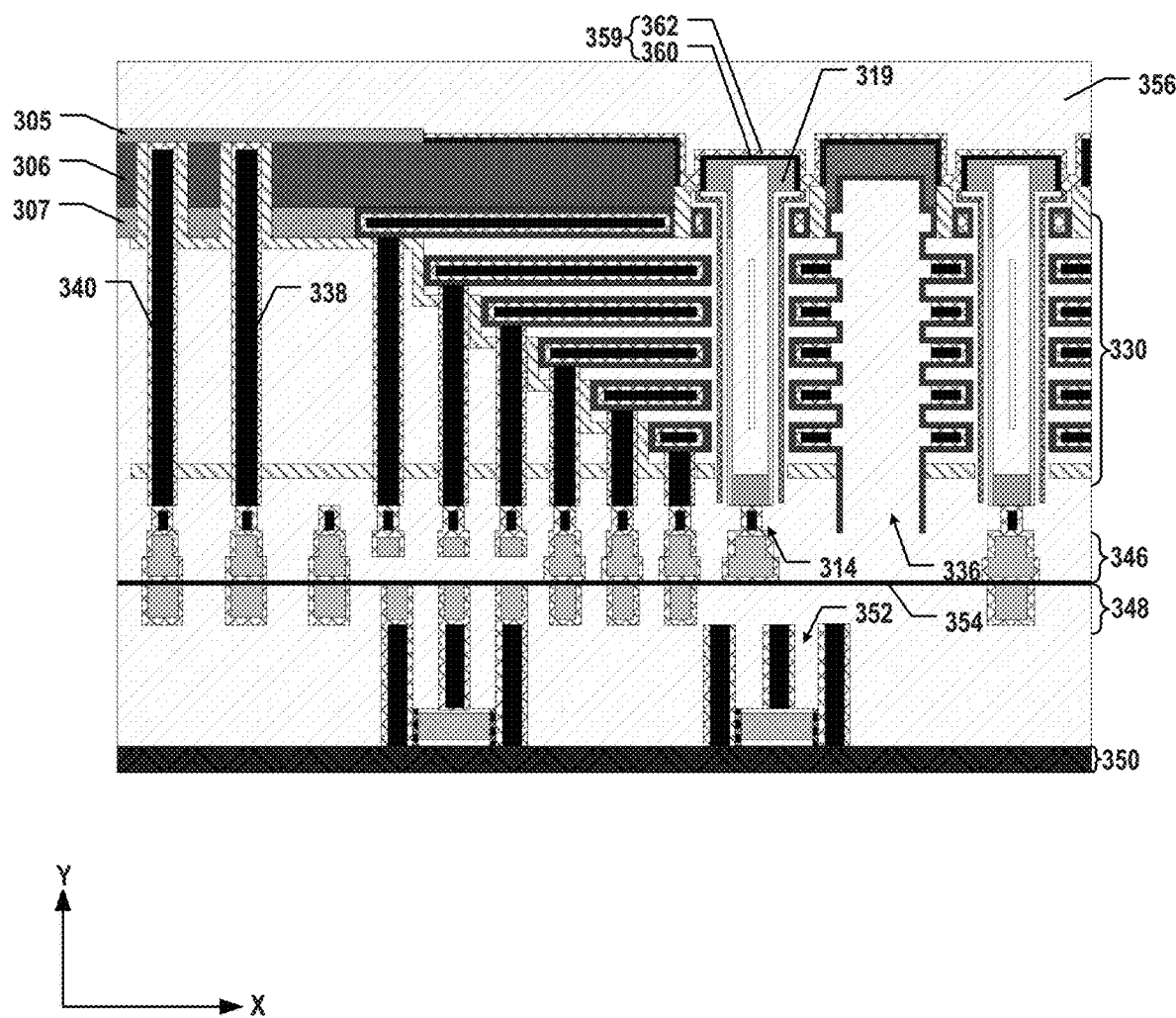

As illustrated in FIG. 3K, the part of memory film (e.g., shown in FIG. 3J) in the first portion of channel structure 314 facing N-type doped semiconductor layer 306 is removed to expose the part of semiconductor channel 318 in the first portion of channel structure 314.

In some embodiments, parts of storage layer 316, blocking layer 317, and tunneling layer 315 in the first portion of channel structure 314 are removed to form a recess (not shown) surrounding the part of semiconductor channel 318 in the first portion of channel structure 314. In some embodiments, two wet etching processes are sequentially performed. For example, storage layer 316 including silicon nitride may be selectively removed using wet etching with suitable etchants, such as phosphoric acid, without etching N-type doped semiconductor layer 306 including polysilicon. Then, blocking layer 317 and tunneling layer 315 including silicon oxide may be selectively removed using wet etching with suitable etchants, such as hydrofluoric acid, without etching N-type doped semiconductor layer 306 and semiconductor channel 318 including polysilicon. The etching of storage layer 316, blocking layer 317, and tunneling layer 315 can be controlled by controlling the etching time and/or etching rate, such that the etching does not continue to affect the rest of storage layer 316, blocking layer 317, and tunneling layer 315 in the second portion of channel structure 314 facing memory stack 330. It is understood that in some examples in which barrier structure 309 exists and has the same material as blocking layer 317 and tunneling layer 315, such as silicon oxide, the etching of blocking layer 317 and tunneling layer 315 may also remove part of barrier structure 309 surrounding the first portion of channel structure 314, leaving the remainder of barrier structure 309 surrounding part of the second portion of channel structure 314. Nevertheless, the doped part of semiconductor channel 318 in the first portion of channel structure 314 can be exposed after the etching.

Method 400 proceeds to operation 414, as illustrated in FIG. 4, in which a conductive layer in contact with the semiconductor layer and the exposed part of the semiconductor channel in the first portion of the channel structure is formed. In some embodiments, to form the conductive layer, a metal silicide layer is formed on the semiconductor layer and the exposed part of the semiconductor channel in the first portion of the channel structure, and a metal layer is formed on the metal silicide layer.

As illustrated in FIG. 3K, a conductive layer 359 is formed in the recess over the doped part of semiconductor channel 318 in the first portion of channel structure 314, as well as outside of the recess on N-type doped semiconductor layer 306. In some embodiments, to form conductive layer 359, a metal silicide layer 360 is formed in the recess to be in contact with the doped part of semiconductor channel 318 in the first portion of channel structure 314 and outside of the recess to be in contact with N-type doped semiconductor layer 306, and a metal layer 362 is formed on metal silicide layer 360. In one example, a metal film (e.g., Co, Ni, or Ti) may be deposited on the sidewall and bottom surface of the recess and on N-type doped semiconductor layer 306 using one or more thin film deposition processes, such as ALD, CVD, PVD, any other suitable processes, or any combination thereof. The metal film can be in contact with polysilicon of N-type doped semiconductor layer 306 and the doped part of semiconductor channel 318 in the first portion of channel structure 314. A silicidation process can then be performed on the metal film and the polysilicon by a thermal treatment (e.g., annealing, sintering, or any other suitable process) to form metal silicide layer 360 along the sidewall and bottom surface of the recess and on N-type doped semiconductor layer 306. Metal layer 362 then can be formed on metal silicide layer 360 by depositing another metal film (e.g., W, Al, Ti, TiN, Co, and/or Ni) using one or more thin film deposition processes, such as ALD, CVD, PVD, any other suitable processes, or any combination thereof, on metal silicide layer 360. In another example, instead of depositing two metal films separately, a single metal film (e.g., Co, Ni, or Ti) may be deposited into the recess and on N-type doped semiconductor layer 306 using one or more thin film deposition processes, such as ALD, CVD, PVD, any other suitable processes, or any combination thereof. A silicidation process then can be performed on the metal film and the polysilicon by a thermal treatment (e.g., annealing, sintering, or any other suitable process), such that part of the metal film forms metal silicide layer 360 along the sidewall and bottom surface of the recess and on N-type doped semiconductor layer 306, while the remainder of the metal film becomes metal layer 362 on metal silicide layer 360. In some embodiments, conductive layer 359 is patterned and etched, such that it does not cover the remainder of first isolation layer 305 in the peripheral region.

Figure 3L:
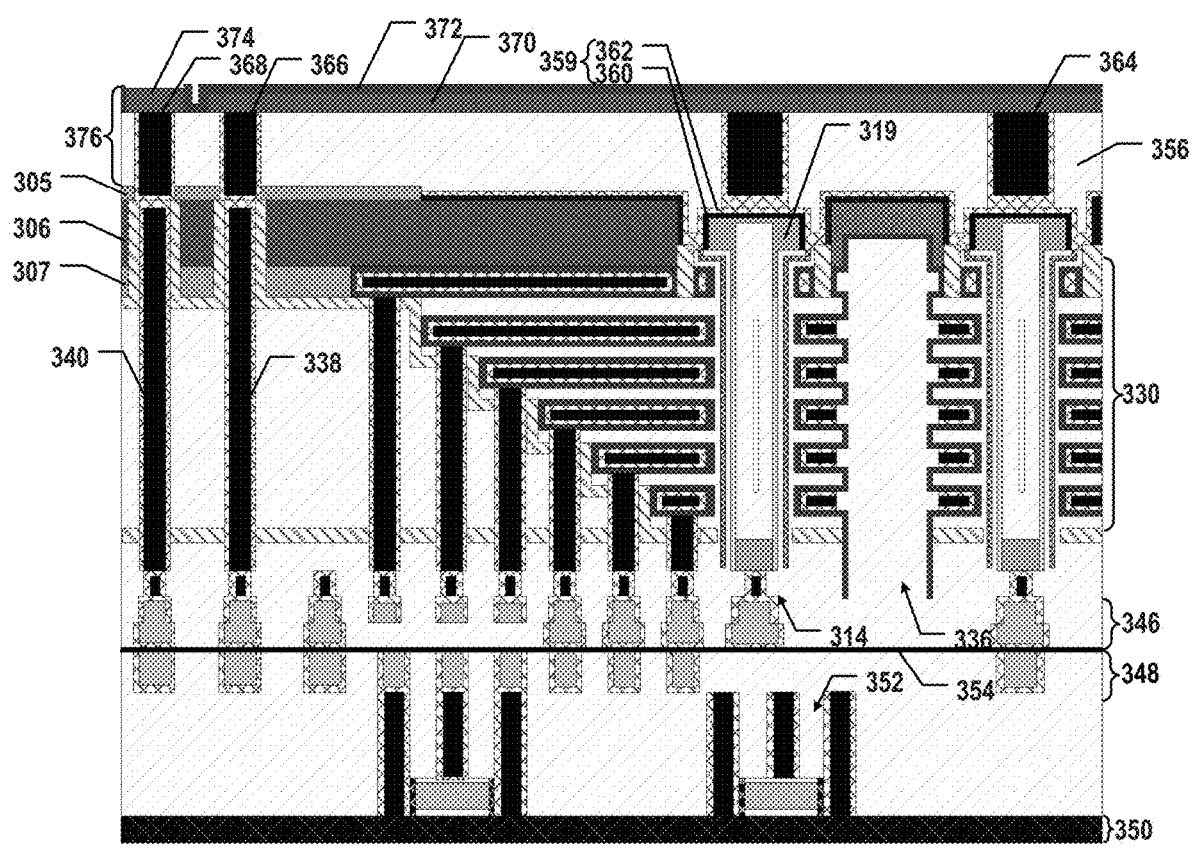

Method 400 proceeds to operation 416, as illustrated in FIG. 4, in which a source contact in contact with the conductive layer is formed. As illustrated in FIG. 3L, one or more ILD layers 356 are formed on conductive layer 359 (and the remainder of first isolation layer 305). ILD layers 356 can be formed by depositing dielectric materials on the top surface of conductive layer 359 using one or more thin film deposition processes, such as ALD, CVD, PVD, any other suitable processes, or any combination thereof. Source contact openings (not shown) can be formed through ILD layers 356 to reach conductive layer 359. In some embodiments, the source contact openings are formed using wet etching and/or dry etching, such as RIE. As illustrated in FIG. 3L, source contacts 364 are formed in the source contact openings at the backside of N-type doped semiconductor layer 306. Source contact 364 is above memory stack 330 and in contact with conductive layer 359, according to some embodiments. In some embodiments, one or more conductive materials are deposited into the source contact opening using one or more thin film deposition processes, such as ALD, CVD, PVD, any other suitable processes, or any combination thereof, to fill the source contact opening with an adhesive layer (e.g., TiN) and a conductor layer (e.g., W). A planarization process, such as CMP, can then be performed to remove the excess conductive materials, such that the top surface of source contact 364 is flush with the top surface of ILD layers 356.

Method 400 proceeds to operation 418, as illustrated in FIG. 4, in which an interconnect layer is formed above and in contact with the source contact. As illustrated in FIG. 3L, a redistribution layer 370 is formed above and in contact with source contacts 364. In some embodiments, redistribution layer 370 is formed by depositing a conductive material, such as Al, on the top surfaces of ILD layers 356 and source contacts 364 using one or more thin film deposition processes, such as ALD, CVD, PVD, any other suitable processes, or any combination thereof. A passivation layer 372 can be formed on redistribution layer 370. In some embodiments, passivation layer 372 is formed by depositing a dielectric material, such as silicon nitride, using one or more thin film deposition processes, such as ALD, CVD, PVD, any other suitable processes, or any combination thereof. An interconnect layer 376 including ILD layers 356, redistribution layer 370, and passivation layer 372 is thereby formed, according to some embodiments.

As illustrated in FIG. 3L, contacts 366 and 368 are formed at the backside of N-type doped semiconductor layer 306. Contacts 366 and 368 extend vertically through ILD layers 356 and the remainder of first isolation layer 305, according to some embodiments. Contacts 366 and 368 and source contact 364 can be formed using the same deposition process to reduce the number of deposition processes. In some embodiments, contacts 366 and 368 are laterally aligned and in contact with peripheral contacts 338 and 340, respectively, as well. As illustrated in FIG. 3L, a contact pad 374 is formed above and in contact with contact 368. In some embodiments, part of passivation layer 372 covering contact 368 is removed by wet etching and/or dry etching to expose part of redistribution layer 370 underneath to form contact pad 374. As a result, contact pad 374 for pad-out can be electrically connected to peripheral circuits 352 through contact 368, peripheral contact 340, and bonding layers 346 and 348.

According to one aspect of the present disclosure, a 3D memory device includes a memory stack including interleaved stack conductive layers and stack dielectric layers, a semiconductor layer, and a channel structure extending vertically through the memory stack into the semiconductor layer. A first lateral dimension of a first portion of the channel structure facing the semiconductor layer is greater than a second lateral dimension of a second portion of the channel structure facing the memory stack. The channel structure includes a memory film and a semiconductor channel. A first doping concentration of part of the semiconductor channel in the first portion of the channel structure is greater than a second doping concentration of part of the semiconductor channel in the second portion of the channel structure.

In some embodiments, the first doping concentration is between about $10^{19}$ cm$^{-3}$ and about $10^{21}$ cm$^{-3}$.

In some embodiments, the part of the semiconductor channel in the first portion of the channel structure includes N-type doped polysilicon.

In some embodiments, the semiconductor layer includes N-type doped polysilicon.

In some embodiments, the 3D memory device further includes a conductive layer in contact with the semiconductor layer and the part of the semiconductor channel in the first portion of the channel structure.

In some embodiments, the conductive layer includes a metal silicide layer in contact with the part of the semiconductor channel and a metal layer in contact with the metal silicide layer.

In some embodiments, the 3D memory device further includes a source contact in contact with the conductive layer.

In some embodiments, the 3D memory device further a source contact in contact with the semiconductor layer.

In some embodiments, the first portion of the channel structure further includes an enlarging structure in contact with the semiconductor channel, and a third doping concentration of the enlarging structure is equal to or greater than the first doping concentration.

In some embodiments, the enlarging structure includes polysilicon or silicon oxide.

In some embodiments, the 3D memory device further includes an insulating structure extending vertically through the memory stack and extending laterally to separate the memory stack into a plurality of blocks.

In some embodiments, the 3D memory device further includes a barrier structure surrounding part of the second portion of the channel structure.

According to another aspect of the present disclosure, a 3D memory device includes a semiconductor structure including a memory stack including interleaved stack conductive layers and stack dielectric layers, a semiconductor layer, and a channel structure extending vertically through the memory stack into the semiconductor layer. The channel structure includes a memory film and a semiconductor channel A doping concentration of the semiconductor channel is greater towards a source than away from the source.

In some embodiments, a first doping concentration of part of the semiconductor channel in a first portion of the channel structure facing the semiconductor layer is greater than a second doping concentration of part of the semiconductor channel in a second portion of the channel structure facing the memory stack.

In some embodiments, a first lateral dimension of the first portion of the channel structure is greater than a second lateral dimension of the second portion of the channel structure.

In some embodiments, the first portion of the channel structure further includes an enlarging structure in contact with the semiconductor channel, and a third doping concentration of the enlarging structure is equal to or greater than the first doping concentration.

In some embodiments, the enlarging structure includes polysilicon or silicon oxide.

In some embodiments, the first doping concentration is between about $10^{19}$ cm$^{-3}$ and about $10^{21}$ cm$^{-3}$.

In some embodiments, the part of the semiconductor channel in the first portion of the channel structure includes N-type doped polysilicon.

In some embodiments, the semiconductor layer includes N-type doped polysilicon.

In some embodiments, the second semiconductor structure further includes a conductive layer in contact with the semiconductor layer and the part of the semiconductor channel in the first portion of the channel structure.

In some embodiments, the conductive layer includes a metal silicide layer in contact with the part of the semiconductor channel and a metal layer in contact with the metal silicide layer.

In some embodiments, the second semiconductor structure further includes a source contact in contact with the conductive layer.

In some embodiments, the second semiconductor structure further includes a source contact in contact with the semiconductor layer.

In some embodiments, the second semiconductor structure further includes an insulating structure extending vertically through the memory stack and extending laterally to separate the memory stack into a plurality of blocks.

In some embodiments, the second semiconductor structure further includes a barrier structure surrounding part of the second portion of the channel structure.

In some embodiments, the 3D memory device further includes another semiconductor structure including a peripheral circuit, and a bonding interface between the semiconductor structure and the another semiconductor structure.

According to still another aspect of the present disclosure, a method for forming a 3D memory device is disclosed. A semiconductor layer is formed above a substrate, and a stack structure is formed above the semiconductor layer. A channel structure extending vertically through the stack structure and the semiconductor layer is formed. The channel structure includes a memory film and a semiconductor channel. A first doping concentration of part of the semiconductor channel in a first portion of the channel structure facing the semiconductor layer is greater than a second doping concentration of part of the semiconductor channel in a second portion of the channel structure facing the stack structure. The substrate and part of the memory film in the first portion of the channel structure are removed to expose the part of the semiconductor channel in the first portion of the channel structure. A conductive layer in contact with the semiconductor layer and the exposed part of the semiconductor channel in the first portion of the channel structure is formed.

In some embodiments, a first isolation layer is formed between the substrate and the semiconductor layer, and a second isolation layer is formed between the semiconductor layer and the stack structure.

In some embodiments, to form the channel structure, a channel hole extending vertically through the stack structure, the second isolation layer, and the semiconductor layer is formed, stopped at the first isolation layer. A first lateral dimension of a first portion of the channel hole facing the semiconductor layer is greater than a second lateral dimension of a second portion of the channel hole facing the stack structure and the second isolation layer. In some embodiments, to form the channel structure, a memory film and a semiconductor channel are sequentially formed along a sidewall and a bottom surface of the channel hole, and a doped enlarging structure is formed over the part of the semiconductor channel in the first portion of the channel hole. In some embodiments, to form the channel structure, a dopant is diffused from the doped enlarging structure to the semiconductor channel, such that the first doping concentration of the part of the semiconductor channel in the first portion of the channel hole is greater than the second doping concentration of the part of the semiconductor channel in the second portion of the channel hole.

In some embodiments, a barrier structure extending vertically through the second isolation layer and the semiconductor layer is formed. In some embodiments, to form the channel hole, the channel hole extending vertically through the stack structure, the second isolation layer, and the semiconductor layer is etched, stopped at the first isolation layer. In some embodiments, the etching of the first portion of the channel hole is laterally stopped by the barrier structure.

In some embodiments, to form the doped enlarging structure, a layer of polysilicon or silicon oxide is deposited over the semiconductor channel in the channel hole, the layer of polysilicon or silicon oxide is in situ doped with the dopant, and part of the layer of polysilicon or silicon oxide over the semiconductor channel in the second portion of the channel hole is etched.

In some embodiments, the dopant is an N-type dopant, and a third doping concentration of the doped enlarging structure is between about $10^{21}$ cm$^{-3}$ and about $10^{22}$ cm$^{-3}$ prior to the diffusion.

In some embodiments, to sequentially form the memory film and the semiconductor channel, layers of silicon oxide, silicon nitride, silicon oxide, and intrinsic polysilicon are sequentially deposited.

In some embodiments, to form the conductive layer, a metal silicide layer is formed on the semiconductor layer and the exposed part of the semiconductor channel in the first portion of the channel structure, and a metal layer is formed on the metal silicide layer.

In some embodiments, a source contact in contact with the conductive layer is formed after removing the substrate.

In some embodiments, a source contact in contact with the semiconductor layer is formed prior to removing the substrate.

In some embodiments, the semiconductor layer includes N-type doped polysilicon.

In some embodiments, prior to removing the substrate, an opening extending vertically through the stack structure is formed, the stack structure is replaced with a memory stack including interleaved stack conductive layer and stack dielectric layers through the opening, and an insulating structure is formed in the opening.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
a memory stack comprising interleaved stack conductive layers and stack dielectric layers;
a semiconductor layer; and
a channel structure extending vertically through the memory stack into the semiconductor layer, wherein
a first lateral dimension of a first portion of the channel structure facing the semiconductor layer is greater than a second lateral dimension of a second portion of the channel structure facing the memory stack;
the channel structure comprises a memory film and a semiconductor channel;
a first doping concentration of part of the semiconductor channel in the first portion of the channel structure is greater than a second doping concentration of part of the semiconductor channel in the second portion of the channel structure; and
the first portion of the channel structure comprises an enlarging structure in contact with the semiconductor channel and facing the semiconductor layer, and the enlarging structure extends laterally to have a wall thickness greater than a wall thickness of the semiconductor channel facing the memory stack.

2. The 3D memory device of claim 1, wherein the first doping concentration is between about $10^{19}$ cm$^{-3}$ and about $10^{21}$ cm$^{-3}$.

3. The 3D memory device of claim 1, wherein the part of the semiconductor channel in the first portion of the channel structure comprises N-type doped polysilicon.

4. The 3D memory device of claim 1, wherein the semiconductor layer comprises N-type doped polysilicon.

5. The 3D memory device of claim 1, further comprising:
a conductive layer in contact with the semiconductor layer and the part of the semiconductor channel in the first portion of the channel structure.

6. The 3D memory device of claim 5, wherein the conductive layer comprises a metal silicide layer in contact with the part of the semiconductor channel and a metal layer in contact with the metal silicide layer.

7. The 3D memory device of claim 5, further comprising a source contact in contact with the conductive layer.

8. The 3D memory device of claim 1, further comprising a source contact in contact with the semiconductor layer.

9. The 3D memory device of claim 1, wherein a third doping concentration of the enlarging structure is equal to or greater than the first doping concentration.

10. The 3D memory device of claim 9, wherein the enlarging structure comprises polysilicon or silicon oxide.

11. The 3D memory device of claim 1, further comprising an insulating structure extending vertically through the memory stack and extending laterally to separate the memory stack into a plurality of blocks.

12. The 3D memory device of claim 1, further comprising a barrier structure surrounding part of the second portion of the channel structure.

13. A three-dimensional (3D) memory device, comprising:
- a semiconductor structure comprising:
  - a memory stack comprising interleaved stack conductive layers and stack dielectric layers;
  - a semiconductor layer; and
  - a channel structure extending vertically through the memory stack into the semiconductor layer, wherein the channel structure comprises a memory film and a semiconductor channel, and a doping concentration of the semiconductor channel is greater towards a source than away from the source, wherein:
    - the channel structure comprises a semiconductor channel and an enlarging structure in contact with the semiconductor channel and facing the semiconductor layer; and
    - a wall thickness of the enlarging structure is greater than a wall thickness of the semiconductor channel facing the memory stack.

14. The 3D memory device of claim 13, wherein a first doping concentration of part of the semiconductor channel in a first portion of the channel structure facing the semiconductor layer is greater than a second doping concentration of part of the semiconductor channel in a second portion of the channel structure facing the memory stack, the first portion of the channel structure comprising the enlarging structure.

15. The 3D memory device of claim 14, wherein a first lateral dimension of the first portion of the channel structure is greater than a second lateral dimension of the second portion of the channel structure.

16. A method for forming a three-dimensional (3D) memory device, comprising:
- forming a semiconductor layer above a substrate and a stack structure above the semiconductor layer;
- forming a channel structure extending vertically through the stack structure and the semiconductor layer, wherein the channel structure comprises a memory film and a semiconductor channel, and a first doping concentration of part of the semiconductor channel in a first portion of the channel structure facing the semiconductor layer is greater than a second doping concentration of part of the semiconductor channel in a second portion of the channel structure facing the stack structure;
- removing the substrate and part of the memory film in the first portion of the channel structure to expose the part of the semiconductor channel in the first portion of the channel structure; and
- forming a conductive layer in contact with the semiconductor layer and the exposed part of the semiconductor channel in the first portion of the channel structure.

17. The method of claim 16, further comprising forming a first isolation layer between the substrate and the semiconductor layer and a second isolation layer between the semiconductor layer and the stack structure.

18. The method of claim 17, wherein forming the channel structure comprises:
- forming a channel hole extending vertically through the stack structure, the second isolation layer, and the semiconductor layer, stopped at the first isolation layer, wherein a first lateral dimension of a first portion of the channel hole facing the semiconductor layer is greater than a second lateral dimension of a second portion of the channel hole facing the stack structure and the second isolation layer;
- sequentially forming a memory film and a semiconductor channel along a sidewall and a bottom surface of the channel hole;
- forming a doped enlarging structure over the part of the semiconductor channel in the first portion of the channel hole; and
- diffusing a dopant from the doped enlarging structure to the semiconductor channel, such that the first doping concentration of the part of the semiconductor channel in the first portion of the channel hole is greater than the second doping concentration of the part of the semiconductor channel in the second portion of the channel hole.

19. The method of claim 18, wherein forming the doped enlarging structure comprises:
- depositing a layer of polysilicon or silicon oxide over the semiconductor channel in the channel hole;
- in situ doping the layer of polysilicon or silicon oxide with the dopant; and
- etching part of the layer of polysilicon or silicon oxide over the semiconductor channel in the second portion of the channel hole.

20. The method of claim 18, wherein the dopant is an N-type dopant, and a third doping concentration of the doped enlarging structure is between about $10^{21}$ cm$^{-3}$ and about $10^{22}$ cm$^{-3}$ prior to the diffusion.

* * * * *